(12) United States Patent
Chang

(10) Patent No.: US 10,991,686 B2
(45) Date of Patent: Apr. 27, 2021

(54) SUPER CMOS DEVICES ON A MICROELECTRONICS SYSTEM

(71) Applicant: SCHOTTKY LSI, INC., Mountain View, CA (US)

(72) Inventor: Augustine Wei-Chun Chang, Mountain View, CA (US)

(73) Assignee: SCHOTTKY LSI, INC., Mountain View, CA (US)

( * ) Notice: Subject to any disclaimer, the term of this patent is extended or adjusted under 35 U.S.C. 154(b) by 0 days.

(21) Appl. No.: 16/532,227

(22) Filed: Aug. 5, 2019

(65) Prior Publication Data

US 2020/0144248 A1   May 7, 2020

Related U.S. Application Data

(60) Continuation of application No. 15/799,921, filed on Oct. 31, 2017, now Pat. No. 10,373,950, which is a
(Continued)

(51) Int. Cl.
*H01L 29/872* (2006.01)
*H01L 27/06* (2006.01)
(Continued)

(52) U.S. Cl.
CPC ...... *H01L 27/0629* (2013.01); *H01L 21/8238* (2013.01); *H01L 25/065* (2013.01);
(Continued)

(58) Field of Classification Search
None
See application file for complete search history.

(56) References Cited

U.S. PATENT DOCUMENTS 3,508,211 A   4/1970 Wegener
3,978,577 A   9/1976 Bhattacharyya et al.
(Continued)

FOREIGN PATENT DOCUMENTS

GB   2054955 A   2/1981

OTHER PUBLICATIONS

Ashby, L, et al., ASIC Clock Distribution Using a Phase Locked Loop (PLL), Motorola AN1509, IEEE Xplore Digital Library, US, Sep. 1991 (Abstract).
(Continued)

*Primary Examiner* — Benjamin P Sandvik
(74) *Attorney, Agent, or Firm* — Morgan, Lewis & Bockius LLP

(57) ABSTRACT

A low cost IC solution is disclosed to provide Super CMOS microelectronics macros. Hereinafter, the Super CMOS or Schottky CMOS all refer to SCMOS. The SCMOS device solutions with a niche circuit element, the complementary low threshold Schottky barrier diode pairs (SBD) made by selected metal barrier contacts (Co/Ti) to P— and N—Si beds of the CMOS transistors. A DTL like new circuit topology and designed wide contents of broad product libraries, which used the integrated SBD and transistors (BJT, CMOS, and Flash versions) as basic components. The macros include diodes that are selectively attached to the diffusion bed of the transistors, configuring them to form generic logic gates, memory cores, and analog functional blocks from simple to the complicated, from discrete components to all grades of VLSI chips. Solar photon voltaic electricity conversion and bio-lab-on-a-chip are two newly extended fields of the SCMOS IC applications.

20 Claims, 29 Drawing Sheets

Related U.S. Application Data continuation of application No. 15/358,049, filed on Nov. 21, 2016, now Pat. No. 9,806,072, which is a continuation of application No. 14/793,690, filed on Jul. 7, 2015, now Pat. No. 9,502,379, which is a continuation of application No. 13/931,315, filed on Jun. 28, 2013, now Pat. No. 9,077,340, which is a division of application No. 12/343,465, filed on Dec. 23, 2008, now Pat. No. 8,476,689.

(60) Provisional application No. 62/062,800, filed on Oct. 10, 2014.

(51) Int. Cl.
| | |
|---|---|
| *H01L 27/02* | (2006.01) |
| *H01L 27/07* | (2006.01) |
| *H01L 27/105* | (2006.01) |
| *H01L 27/108* | (2006.01) |
| *H01L 27/112* | (2006.01) |
| *H01L 27/11526* | (2017.01) |
| *H01L 27/11546* | (2017.01) |
| *H01L 27/118* | (2006.01) |
| *H01L 31/032* | (2006.01) |
| *H01L 31/0376* | (2006.01) |
| *H01L 31/072* | (2012.01) |
| *H01L 31/074* | (2012.01) |
| *H03K 19/17728* | (2020.01) |
| *H01L 25/065* | (2006.01) |
| *H01L 21/8238* | (2006.01) |
| *H01L 29/66* | (2006.01) |
| *H01L 31/07* | (2012.01) |
| *H01L 49/02* | (2006.01) |

(52) U.S. Cl.
CPC ...... *H01L 27/0207* (2013.01); *H01L 27/0727* (2013.01); *H01L 27/105* (2013.01); *H01L 27/10897* (2013.01); *H01L 27/112* (2013.01); *H01L 27/11253* (2013.01); *H01L 27/11286* (2013.01); *H01L 27/11293* (2013.01); *H01L 27/11526* (2013.01); *H01L 27/11546* (2013.01); *H01L 27/11807* (2013.01); *H01L 29/66143* (2013.01); *H01L 29/872* (2013.01); *H01L 31/032* (2013.01); *H01L 31/0376* (2013.01); *H01L 31/03762* (2013.01); *H01L 31/07* (2013.01); *H01L 31/072* (2013.01); *H01L 31/074* (2013.01); *H03K 19/17728* (2013.01); *H01L 28/20* (2013.01); *H01L 2924/0002* (2013.01); *Y02E 10/50* (2013.01)

(56) References Cited

U.S. PATENT DOCUMENTS

| | | | |
|---|---|---|---|
| 4,005,469 A | 1/1977 | Chang et al. | |
| 4,050,058 A | 9/1977 | Garlic | |
| 4,129,790 A | 12/1978 | Gani et al. | |
| 4,300,064 A | 11/1981 | Eden | |
| 4,336,601 A | 6/1982 | Tanaka | |
| 4,400,636 A | 8/1983 | Andrade | |
| 4,405,870 A | 9/1983 | Eden | |
| 4,415,817 A | 11/1983 | Fletcher | |
| 4,507,575 A | 3/1985 | Mori et al. | |
| 4,544,939 A | 10/1985 | Kosonocky et al. | |
| 4,609,903 A | 9/1986 | Toyokura et al. | |
| 4,709,166 A | 11/1987 | Banker et al. | |
| 4,931,670 A | 6/1990 | Ting | |
| 5,023,482 A | 6/1991 | Bellavance | |
| 5,407,851 A * | 4/1995 | Roesner ................ | H01L 27/112 257/E27.102 |
| 5,581,503 A * | 12/1996 | Matsubara ........... | G11C 16/105 365/185.33 |
| 5,663,584 A | 9/1997 | Welch | |
| 5,665,993 A | 9/1997 | Keller et al. | |
| 6,025,840 A | 2/2000 | Taylor | |
| 6,036,101 A | 3/2000 | Hass et al. | |
| 6,184,726 B1 | 2/2001 | Haeberli et al. | |
| 6,442,633 B1 | 8/2002 | Chang | |
| 6,590,000 B2 | 7/2003 | Varadaraj | |
| 6,590,800 B2 | 7/2003 | Chang | |
| 6,627,697 B2 | 9/2003 | Barney et al. | |
| 6,777,277 B2 | 8/2004 | Asano et al. | |
| 6,852,578 B2 | 2/2005 | Chang | |
| 7,082,056 B2 | 7/2006 | Chen et al. | |
| 7,135,890 B2 | 11/2006 | Chang | |
| 7,375,547 B2 | 5/2008 | Shimura | |
| 7,375,548 B2 | 5/2008 | Chang | |
| 7,528,017 B2 | 5/2009 | Subramanian et al. | |
| 7,683,433 B2 | 3/2010 | Kapoor et al. | |
| 7,932,537 B2 | 4/2011 | Subramanian et al. | |
| 8,476,689 B2 | 7/2013 | Chang | |
| 9,077,340 B2 | 7/2015 | Chang | |
| 9,806,072 B2 * | 10/2017 | Chang ................. | H01L 27/0207 |
| 10,373,950 B2 * | 8/2019 | Chang .................. | H01L 31/072 |
| 2003/0002321 A1 | 1/2003 | Chang | |
| 2003/0025175 A1 | 2/2003 | Asano et al. | |
| 2004/0159910 A1 | 8/2004 | Fried et al. | |
| 2005/0062071 A1 | 3/2005 | Matsuzawa et al. | |
| 2005/0231237 A1 | 10/2005 | Chang | |
| 2006/0044018 A1 | 3/2006 | Chang | |
| 2006/0113624 A1 | 6/2006 | Wu | |
| 2007/0018692 A1 | 1/2007 | Chang | |
| 2007/0120201 A1 | 5/2007 | Yamaguchi et al. | |
| 2007/0170520 A1 * | 7/2007 | Zhang ............... | H01L 27/11521 257/390 |
| 2008/0002454 A1 * | 1/2008 | Inoue ..................... | H01L 21/84 365/104 |
| 2008/0036503 A1 | 2/2008 | Chang | |
| 2008/0061824 A1 | 3/2008 | Chang | |
| 2008/0107974 A1 | 5/2008 | Douzaka et al. | |
| 2009/0262563 A1 * | 10/2009 | Park ........................ | G11C 5/02 365/51 |
| 2010/0155782 A1 | 6/2010 | Chang | |
| 2010/0228377 A1 | 9/2010 | D'Angelo et al. | |
| 2011/0204381 A1 | 8/2011 | Okada et al. | |
| 2014/0152343 A1 | 6/2014 | Chang | |

OTHER PUBLICATIONS

Chang, Office Action, U.S. Appl. No. 12/343,465, dated Mar. 21, 2011, 10 pgs.

Chang, Office Action, U.S. Appl. No. 12/343,465, dated Nov. 28, 2011, 5 pgs.

Chang, Office Action, U.S. Appl. No. 12/343,465, dated Oct. 1, 2012, 10 pgs.

Chang, Office Action, U.S. Appl. No. 12/343,465, dated Mar. 30, 2012, 5 pgs.

Chang, Notice of Allowance, U.S. Appl. No. 12/343,465, dated Mar. 4, 2013, 5 pgs.

Chang, Office Action, U.S. Appl. No. 14/793,690, dated Feb. 22, 2016, 6 pgs.

Chang, Office Action, U.S. Appl. No. 15/358,049, dated Mar. 10, 2017, 6 pgs.

Chang, Notice of Allowance, U.S. Appl. No. 15/358,049, dated Jun. 29, 2017, 5 pgs.

Chang, Notice of Allowance, U.S. Appl. No. 15/484,040, dated Aug. 16, 2017, 9 pgs.

Chang, Office Action, U.S. Appl. No. 15/817,026, dated Nov. 27, 2018, 15 pgs.

Chang, Final Office Action, U.S. Appl. No. 15/817,026, dated Jul. 11, 2019, 15 pgs.

Chang Office Action, U.S. Appl. No. 15/799,921, dated Oct. 31, 2018, 6 pgs.

Chang, Notice of Allowance, U.S. Appl. No. 15/799,921, dated Mar. 21, 2019, 8 pgs.

(56) References Cited

OTHER PUBLICATIONS

Fuller, "Solar Cell Notes from Sze", PN Junction Cell, CdS cell, Raynolds Sigle/Poly Si Crystal and Amorphous Thin Film, US, 1954 (17 pages).

Gerrits, J., et al., Modeling and Simulation of a Dipole Antenna for UWB Applications Using Equivalent Spice Circuits, Centre Suisse d'Eiectronique et de Microtechnique SA (CSEM), Neuchatei-Switzerland, 2003, (5 pages).

Katz, David, et al., Fundamentals of Embedded Audio, Part 1, DSP Design Line, Analog Devices, Sep. 3, 2007 (8 pages).

Katz, David, et al., Fundamentals of Embedded Audio, Part 2, DSP Design Line, Analog Devices, Sep. 10, 2007 (12 pages).

Katz, David, et al., Fundamentals of Embedded Audio, Part 3, DSP Design Line, Video Imaging Design Line, Sep. 17, 2007 (8 pages).

Liu, Yang, et al., IC/Microfluidic Hybrid System for Biology 2005: Review, (Invited Paper) IEEE BCTM10A, 2005, Harvard University, Cambridge, MA 02138, US (8 pages).

Schottky LSI, Inc., International Search Report and Written Opinion, PCT/US2015/055020, dated Jan. 27, 2016, 9 pgs.

Schottky LSI, Inc., International Preliminary Report on Patentability, PCT/US2015/055020, dated Apr. 11, 2017, 7 pgs.

Schottky LSI, Inc., Communication Pursuant to Rules 161(2) and 162 EP15849239.7, dated Jun. 2, 2017, 2 pgs.

Schottky LSI, Inc., Extended European Search Report. EP15849239.7, dated May 8, 2018, 13 pgs.

Yang, Jeffrey, et al., A-Si Solar Cell White Paper, Amorphous Silicon Based Photovoltaics—From Earth to the "Final Frontier", US, 2003, (10 pages).

Yang, Jeffrey, et al., Amorphous Silicon Based Photovoltaics—From Earth to the "Final Frontier", 78 2003 pp. 597-612, Solar Energy Materials & Solar Cells, US, pp. 23-1 thru 23-24.

Zhu, Z., et al., Brief Comparison of Different Rectifier Strutures for RFID Tranponders, Auto-ID Lab at University of Adelaide, North Terrace, Adelaide, Australia 2004, pp. 1-16.

\* cited by examiner

- Min. Isolated BJT dimensions is 20F²

- Min. Isolated NMOS T dimensions is 10F²

GaAs and Si:Ge HBT is seen to replace CMOS SoC devices by IBM since 1990

Table I Performance Characteristic Comparison of GaAs and Si:Ge-HBTs

| Characteristic | GaAs HBT | Si:Ge HBT | Si CMOS | SCMOS |
|---|---|---|---|---|
| GAIN | | | | |
| $f_t$, GHz | 50 | 30 | 1-5 | 15 |
| $F_{max}$, GHz | 70 | 62 | 10 | 30 |
| $G_{max}$@2 GHz, dB | 20 | 23 | | |
| NOISE | | | | |
| $F_{min}$@2 GHz | 1.5 | 0.5 | | |
| $G_{assoc}$ | >20 | >0.5 | | |
| 1/f corner | 1-10 | 0.1-1 | | |
| POWER | Hi-power | Highest power | Hi-power | Extremely Low Dissipation |
| $V_{be}$, V | 1.4 | 0.85 | Vt 0.5-1.1 | 0.1 |
| $V_{knee}$, V | 0.5 | 0.25 | 0.5 | 0.5 |
| FEATURE SIZE (μM) | 2.0 | 0.5 | 0.1 | 0.1 |

- GaAs/Si/Ge drawbacks, process integration incompatible with CMOS
  -cost more; dc currents, less yield
- SCMOS is process compatible - a better alternative for SoC by circuit means

FIG. 1E

SCL Example
SCL 10 In, 1 Out, NOR10 Gate
1 internal net,
2 M1 wiring tracks,
4 small Tx. 10 SBD
10 way Area: 15x11=165 $F^2$
8 way Area: 15x8=120 $F^2$
5 way Area: 15x7=105 $F^2$
VDD ->0.6V, Iact=1 uA
Asy, Clock: 2 GHz, Act. Duty<50%
CMOS+Domino Example
CMOSL 4 In, 1 Out, NA4 Gate
3 internal net,
2 M1 wiring tracks,
8 large Tx, Stacked Paths
4 Way Area: 27x9=243 $F^2$
All short channel, wide Txs
VDD>1.8V, Iact> 10 uA
Syn. Clock: 500 MHz
FIG. 3A
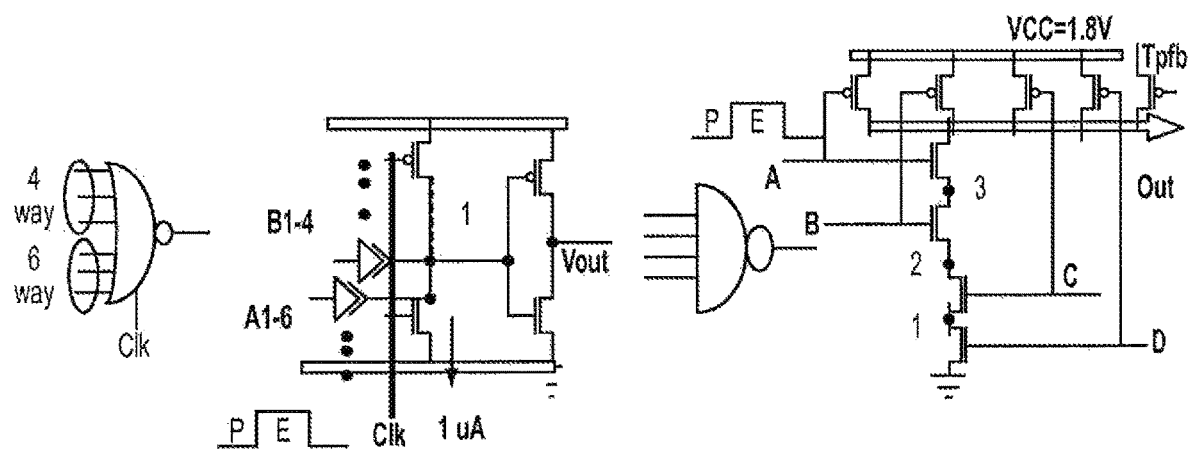
FIG. 3B
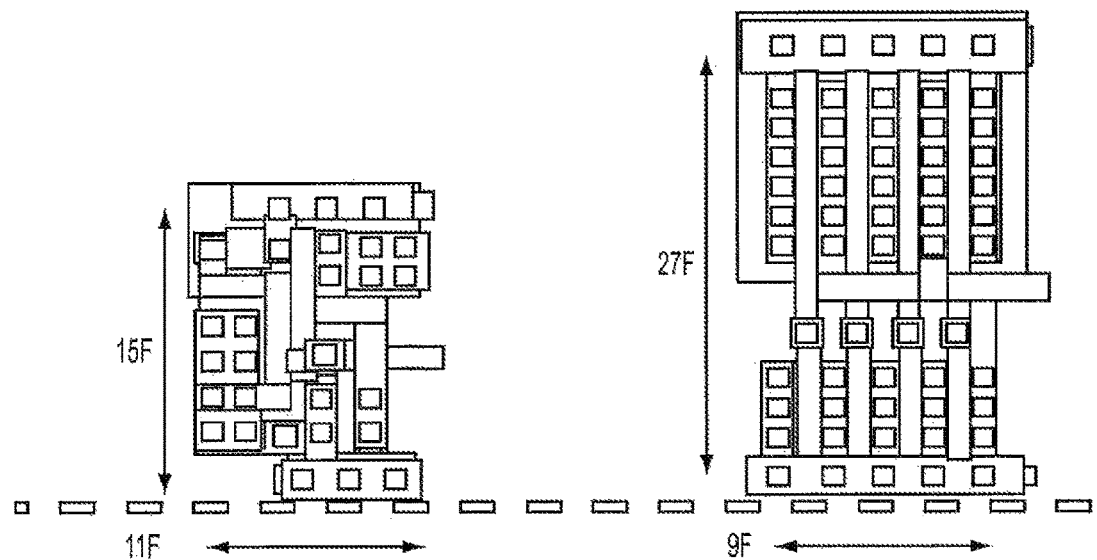
FIG. 3C

|  |  | $J_{oo}$ (mA/cm$^2$) | $V_{oo}$ (V) | FF | $\eta$ (%) |
|---|---|---|---|---|---|
| a-Si:H Single junction | initial | 14.65 | 0.992 | 0.730 | 10.6 |
|  | stable | 14.36 | 0.965 | 0.672 | 9.3 |
| a-Si:H/a-Si:H Same gap Double junction | initial | 7.9 | 1.89 | 0.76 | 11.4 |
|  | stable | 7.9 | 1.83 | 0.70 | 10.1 |
| a-Si:H/a-SiGe:H Dual gap Double junction | initial | 11.04 | 1.762 | 0.738 | 14.4 |
|  | stable | 10.68 | 1.713 | 0.676 | 12.4 |
| a-Si:H / a-SiGe:H a-SiGe:H Triple junction | initial | 8.57 | 2.357 | 0.723 | 14.6 |
|  | stable | 8.27 | 2.294 | 0.684 | 13.0 |

FIG. 5C $I = ART(e^{**}(q^*(Vb/kT)))-1$

- Co/Ti to P+/N-
  - Creates hole currents
  - $q\Phi m = -0.52$ eV

- Co/Ti to N+/P-
  - Creates electron currents
  - $q\Phi m = 0.52$ eV

- A-Si also have similar band gaps but higher than single crystal Si.

THE CONCEPTUAL LENS AND LIGHT CONCENTRATOR APPARATUS

THE MULTI-WAVELENGTH FILTER SYSTEM AND SOLAR CELL DEVICES

THE GaAs PV DEVICE LAYOUT, ABOVE

MEASURED SOLAR CELL PARAMETERS, Voc, Jsc, AND EFFICIENCY

WIRED SOLAR CELLS

Voc TEMPERATURE DEPENDENCY OF SOLAR DEVICES LEFT

The conceptual hybrid IC and bio-lab system

The coil array and coil layout

Invention Mixed SCMOS and CMOS circuits

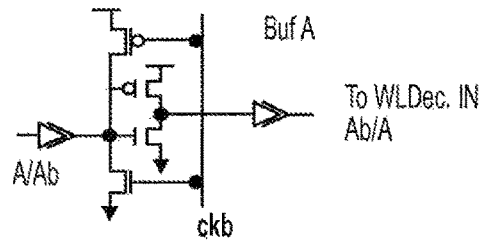
FIG. 10A
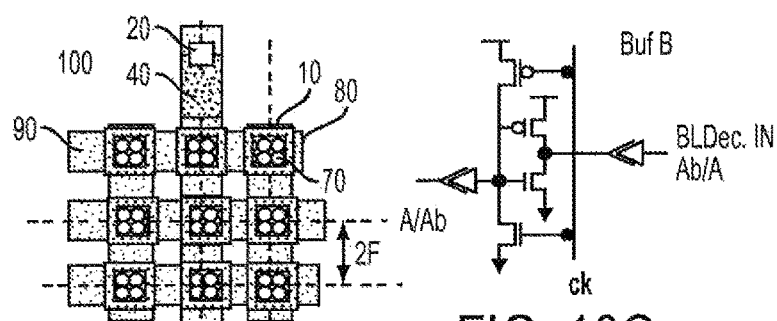
FIG. 10B
FIG. 10C
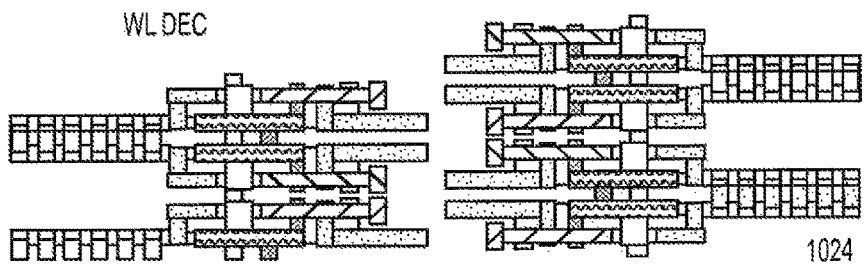
Large MROM Array, 64 Mb
1024x1024x4x16
Serial/Parallel port
Addr:22 bits(10,12)
Bit rates 960, 1920,;3840 MHz
    30MHz X 32, 64, 128
SIO: CS, data,clk, VDD
Parallel port: x16
FIG. 10E
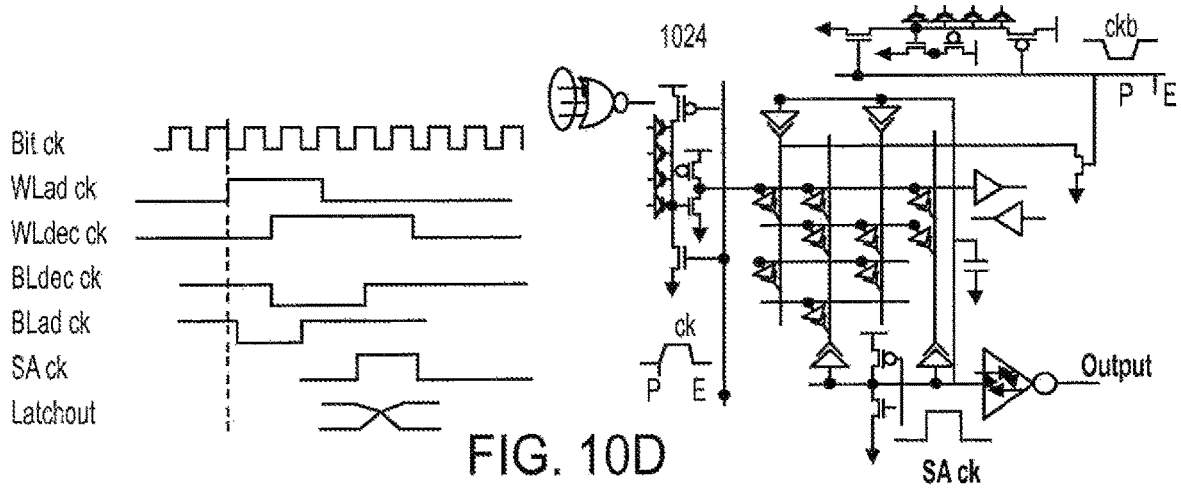
FIG. 10D Peak Power Consumptions With SCMOS devices Peak Power Consumptions during cell phone calls

DIODE RECTIFIER

MOS TRANSIENT EQUIVALENT CIRCUIT

ELECTRICAL EQUIVALENT OF A HALF WAVELENGTH DIPOLE ANTENNA CONNECTED TO A-50 OHM SOURCE

Invention

Invention

Invention

SUPER CMOS DEVICES ON A MICROELECTRONICS SYSTEM

CROSS-REFERENCE. TO RELATED APPLICATION

This application is a continuation of and claims priority to U.S. patent application Ser. No. 15/799,921, filed on Oct. 31, 2017, entitled "Super CMOS Devices on a Microelectronics System," which is a continuation of and claims priority to U.S. patent application Ser. No. 15/358,049, filed on Nov. 21, 2016, now U.S. Pat. No. 9,806,072, issued on Oct. 31, 2017, entitled "Super CMOS Devices on a Microelectronics System," which is a continuation of and claims priority to U.S. patent application Ser. No. 14/793,690, filed on Jul. 7, 2015, now U.S. Pat. No. 9,502,379, issued on Nov. 22, 2016, entitled "Super CMOS Devices on a Microelectronics System," which is a continuation of and claims priority to U.S. patent application Ser. No. 13/931,315, filed on Jun. 28, 2013, now U.S. Pat. No. 9,077,340, issued on Jul. 7, 2015, entitled "Super CMOS Devices on a Microelectronics System," which is a divisional of and claims priority to U.S. patent application Ser. No. 12/343,465, filed on Dec. 23, 2008, now U.S. Pat. No. 8,476,689, issued on Jul. 2, 2013, entitled "SUPER CMOS DEVICES ON A MICROELECTRONICS SYSTEM," U.S. patent application Ser. No. 14/793,690 also claims priority to U.S. Provisional Application No. 62/062,800, filed Oct. 10, 2014, entitled "Super CMOS (SCMOS) Devices on a Microelectronic System." Each of the above patent applications is incorporated herein by reference in its entirety.

FIELD OF THE INVENTION

The present invention relates generally to the low power and mixed signal analog, logic and memory (ALM) devices in a microelectronics system environment, including the methods of designing and manufacturing certain chip sets, module and PCS sub-assemblies.

BACKGROUND OF THE INVENTION

Since the introduction of the IC devices, workers have been trying to increase the IC density, and reduce, the cost of manufacturing chips. The first approach means to put more components/functionality onto a chip. The second approach is to build more chips on a larger substrate. The substrate Si wafer processing facility has grown from 2.5 IN diameter to 12 IN. One wafer may hold 10 k full dices to reduce the unit costs. A common need to serve both purposes well is to reduce the physical dimensions of each circuit's elements.

Various attempts were tried in the past to improve IC functionality, performance, and cost figures. The early IC implementations were done via the bipolar junction transistors, where layers of various diffusion regions were stacked vertically, and isolated transistor pockets contain the three vital to terminal switching terminals, among other R and C circuit elements.

FIG. 1a-1d shows the schematics of the physical layout of the basic transistor in BJT and FET or metal on silicon (MOS) eras. One can see that the FET is always more, compact (about 2.5:1 or more) than the BJT. The drawing showed the transistors with a minimum number of contacts. If one measures the dimension with the minimum feature 'F' size, the isolated BJT takes 20 $F^2$ area versus the MOST 10 $F^2$. Other circuit components, which nave more enclosure contacts in layout implementations, may have more pronounced area impacts.

For the last decade of implementations, it was V-I Scaling that has been needed in order to house more components on a chip. The device complexity has crop over billions of circuit elements with complementary MOS (CMOS) constructs. Still more complications were added to the devices; the Flash transistors as memory blocks, almost doubled in process and mask steps and, added complicated circuit manipulations.

The Nature Technological Barrier and Its Breaker

The CMOS technology came after the BJT. The CMOS surpassed the BJT due to two detrimental factors for the latter. The BJT are bulky, have poor transistor yield, and burns DC power. The CMOS device was slow at the early stage when the thin film was thick.

However, the low cost CMOS sees its own shadow when the PHY scaling approaches the end by 2012, the voltage scale down is facing speed degradation when the power supply is below 1.8V for many analog and digital circuits. The famous Moore's law shall come to a stop: the low cost alternative is around the corner any more.

SUMMARY OF THE INVENTION

The disclosed approaches, semiconductor process means, circuit configurations, component and system Implementations and manufacturing methods are grouped and classified as the Super CMOS (SCMOS) technology, which offers significant cost and performances, reliability advantages, and improved system efficiency over the conventional CMOS IC approaches. The SCMOS device retains the best part of its predecessors such as the Bipolar Junction Transistor (BJT), the Complementary Metal Oxide Silicon Transistor (CMOST) process and circuit solutions, and creates a super set of macros with new and simpler circuit architecture, static and dynamic operations.

The application of the SCMOS techniques is not only to crystalline Si devices, which includes mixed signal and various multi-core Si Chips in the Si single crystal substrates, but may also be expanded to include low cost amorphous Si (A-Si) apparatus as well, as well, as devices with A-Si, GaAs thin film layers on glass or metal panels, and solar cell and engines. The overall solar energy conversion efficiency can be improved beyond the well known conventional means.

Diversified system installations span from discrete components, computer and communication chips, to hybrid assembly of chips and PCB subunits, to medical biochips experiments.

BRIEF DESCRIPTION OF DRAWINGS

FIG. 1e is a table.

FIG. 3A-3C reviews the feature highlights of the SCMOS devices in comparison to the CMOS implementations.

FIG. 5*c* is a table.

FIG. 10*a*-10*e* shows the cross-sectional building blocks of a mask programmed ROM core in the low cost SoC devices.

DETAILED DESCRIPTION OF PREFERRED EMBODIMENTS

Figure 1A:
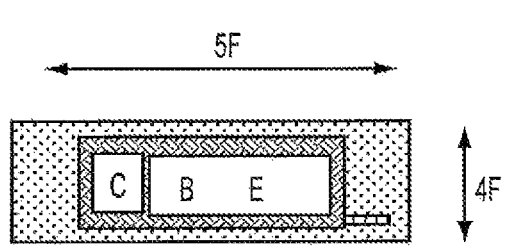
FIG. 1a-1d shows conceptually the transistor structures of the vertical Bipolar and horizontal MOS transistors.
Figure 1C:
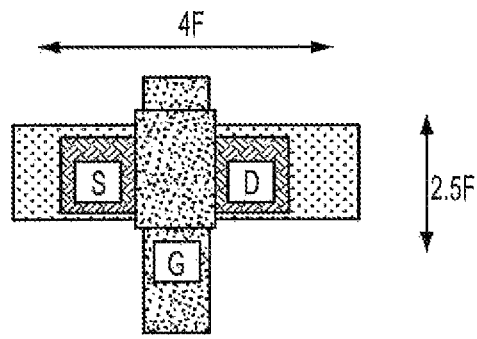
Figure 1B:
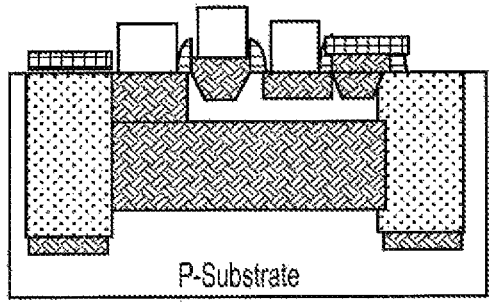
Figure 1D:
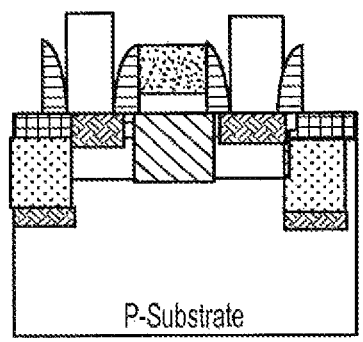

The present invention relates generally to the low power and mixed signal analog, logic and memory (ALM) devices in a microelectronics system environment, including the methods of designing and manufacturing certain chip sets, module and PCB sub-assemblies.

The following description is presented to enable one of ordinary skill in the art to make and use the invention and is, provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Generic IC solution options utilizing mixed analog, logic and memory blocks are proposed with the following ground rules.

1. The main emphasis is to utilize the SBD as much as possible for layout compactness, and its super speed.

2. The Schottky CMOS Logic (SCL) is utilized for its simple circuit configuration, high speed nature, and low signal swing of the high C nets. The biasing schemes of gate functions further enhance array yield and reliability.

3. Dynamic logic circuits are inserted whenever the static circuits are dispensable, and the prorated asynchronous clocks with their low duty cycles can reduce the chip power consumption to 10~50% (100~500 ps windows).

4. The Schottky pass transistor logic (SPTL) is added; it is useful in realizing PLL nets.

5. Multi-core composites of the SCL peripherals, RAM, mask ROM (FIG. 11), FPGA, and MLC blocks (FIG. 10) are proposed. The sizes of the SoC multi-cores are dependent on the applications. The Latch and Mask ROM are the fastest and the lowest cost; the SRAM, and DRAM are the next in speed but are getting more expensive. The NAND Flash is the slowest in operation and also the most costly in masks and processes.

6. Newly added solar cells and solar engines with Si crystal and poly crystals.

7. Newly added bio-lab-on-a-chip applications for life science and medical research.

The process means is based on the Schottky CMOS devices, which are comprised mainly of CMOS transistors, low barrier Schottky barrier diodes (P and N types of SBD), and multi-level cell (MLC) FLASH transistors. One simple implementation may be based on the Mask ROM, the Schottky pass transistor logic (SPTL, shown in FIG. 14*a*-14*b*), and the Schottky CMOS Logic (SCL) gate arrays. Another more expensive implementation is based on the programmable Schottky CMOS Logic (PSCL) gate arrays, wherein a variable threshold NMOS transistor may replace the regular switching transistor. During the initialization of windows, the existing SCAN ring in the PCB chips and/or the FPGA programming arrays can selectively adjust the Vt of the switching transistor, re-configure the intra-connections of the simple SCL gates, and complete all global interconnections of various units. Embedded hardware arrays, soft macro constructs in one chip, and protocols are parsed.

The Variable Threshold transistors thus serve three distinct functions. First, they act as an analog device to store directly nonvolatile information in SCL gates. Second, the transistor input couples the diode tree logic and could be multiplex functions. Third, the Flash and/or SBD arrays may store and operate large amounts of information in mega bytes efficiently. The mixed SCL type FPGA and MLC storages may emerge as the most compact logic and memory devices on chip in Si technology. This is especially true for hand held small systems. Large systems may still require module or PCB packages of multiple chip sets.

A simple device implementation may involve only Mask ROM state machines, small RAM, and logic gates. The SoC device may be built with giga Htz USB2+IO. Giga-Htz speed gate array logic arrays, Mega Byte NV machine codes and using process from logic product line, low cost Si+2Metal layers.

Figure 12:
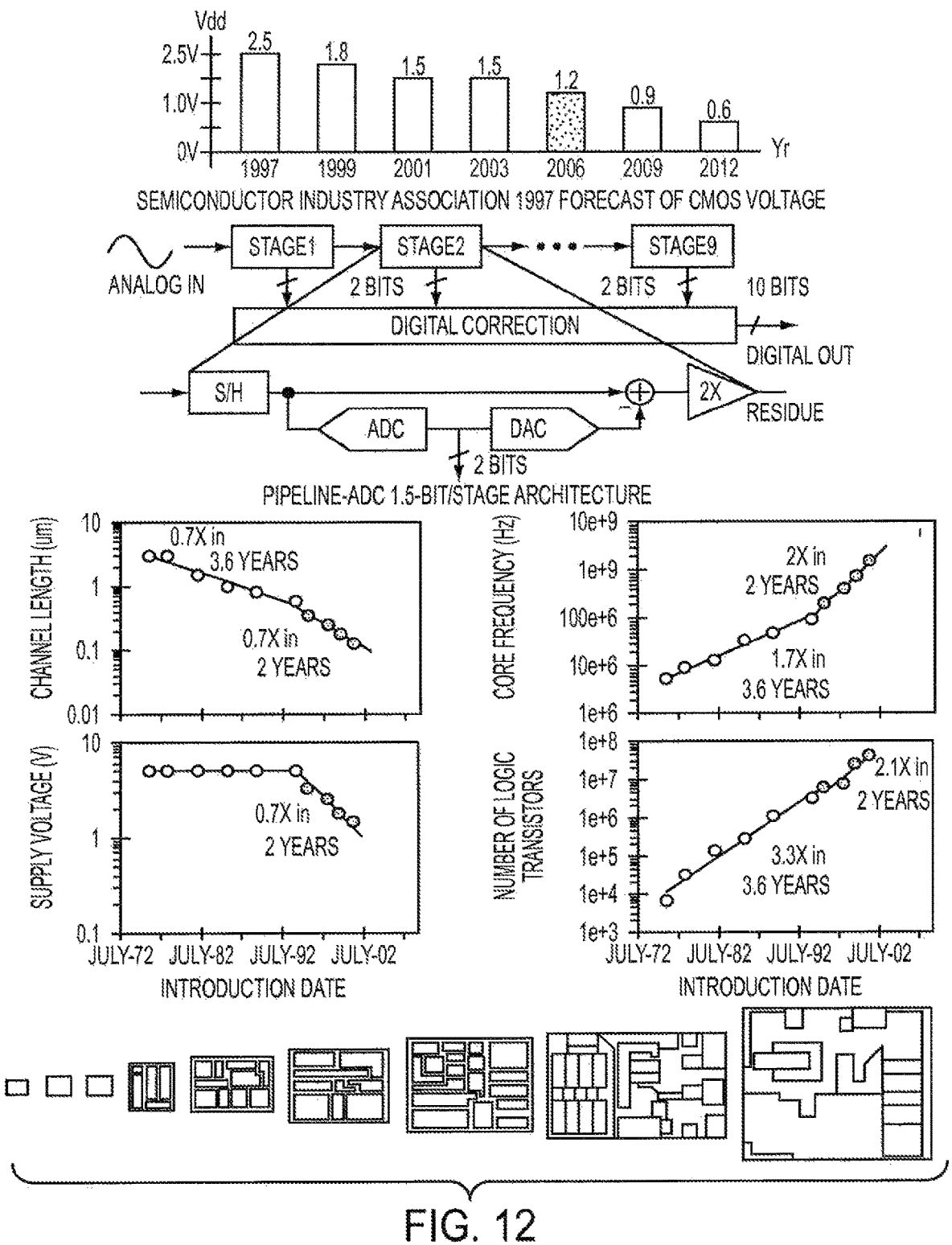
FIG. 12 and FIG. 13 summarize system performance and cost advantages of the SCMOS devices in comparison to existing CMOS TTL technology.

Once again, the SCMOS device means the low power consumption, high performance, and high capacity ICs are designed to achieve best system integration, and to mix and replace conventional CMOS-TTL circuits with less parts. The idea of multi-value logic composed of binary, ternary, and quaternary hardware and firmware is also introduced. FIG. 12 summarizes comparison of system merits in stick charts between the chips from current CMOS TTL and the new SCMOS implementations.

Figure 13:
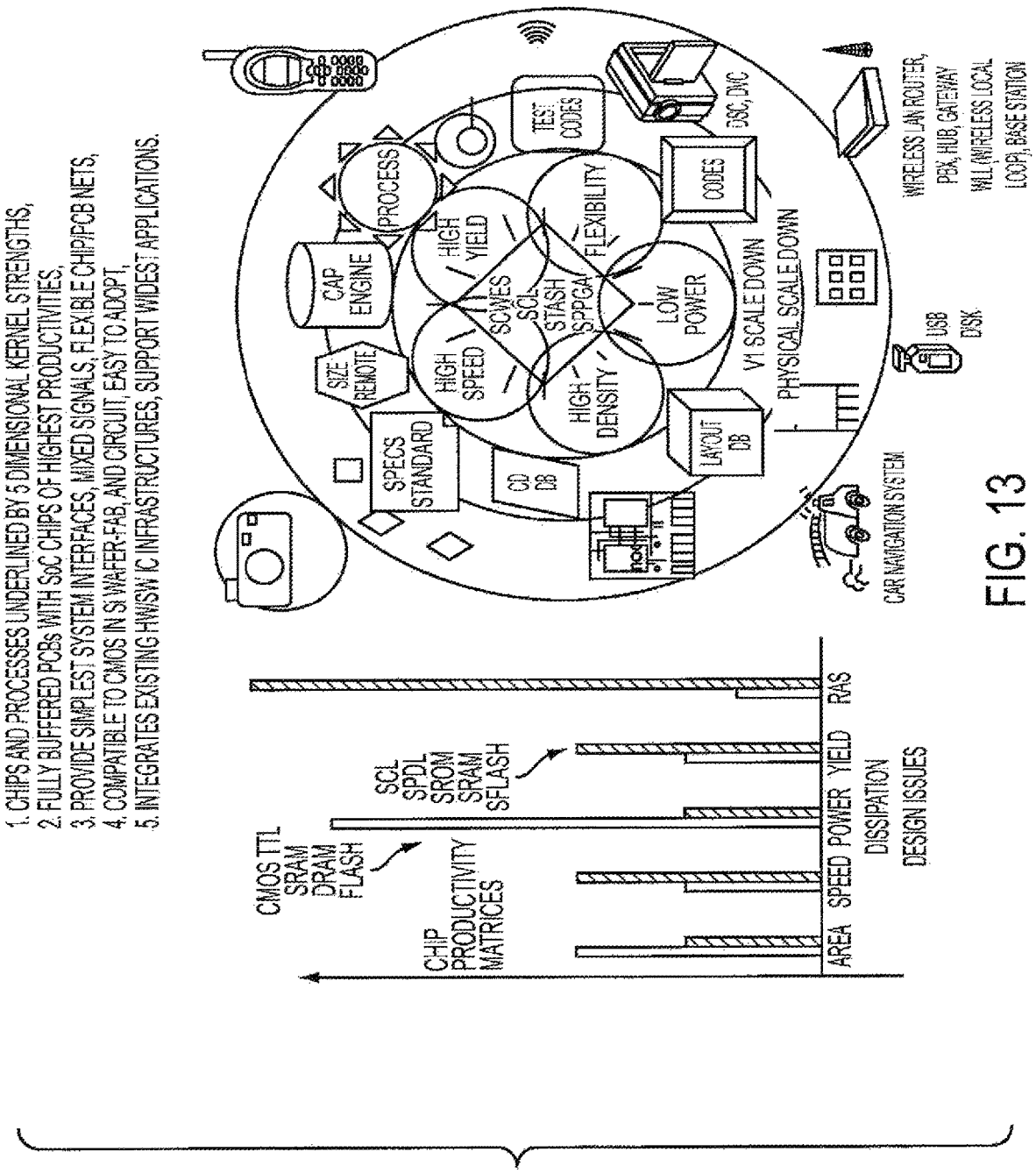

Bottle Neck Pains in High Speed Clock Generation and Lowering the Supply Voltage While the industry is continually driving the IC with CMOS Si technology toward further miniaturization, further scale down of I-V operating conditions, shown in FIG. 13, have met stiff resistance in lowering supply voltages and physical dimensions further. However on the other extreme, we observed that while the power supply in logic device is winding down from 5 volt to 1.8V (with 0.1 um design rules), some important memory core building blocks (i.e. MLC Flash) still require higher on-chip working voltages to the range of 10/20 volts. On one end, complex circuit and mode of operations need higher voltage ranges for biasing conditions to work with. On the other end, lowering supply voltage and signal margins create formidable constraints in complicated CMOS-TTL circuits, which often have high serial transistor paths due to stacked transistors, with high RC time constants, and self biasing body effects. There are severe conflicts that increased device functionality and capacity are against voltage scale down. Addition innovation, such as changing circuit topology, becomes critical to find a breakthrough in other dimensions of design creativity.

The SCL Low Power Solutions for Clocking and Interlace Schemes

One solution to alleviate the inherent CMOS-TTL design and processing problems is to use an innovative active component element-low barrier SSD in CMOS. This was first disclosed in U.S. Pat. No. 6,852,578, "Schottky diode static random access memory (DSRAM) device, a method for making same, and CFET based DTL", issued Feb. 8, 2005, subsequently adopted in other applications such as peripheral units of Schottky Flash (SFLASH) cores, Schottky RAM (ShSRAM, ShDRAM), Schottky ROM (ShROM), and Schottky FPGA (SFPGA). In this invention, an SCL techniques is disclosed for forming space, speed and power efficient constructs for PLL/DLL circuitries (SPLL/SDLL). Basically, it derives from the concept that SCL cells and logic arrays posses the following attributes:

1. Smallest physical size of a contact hole carrying a channel of independent electrical signals.
2. Lowest on-off switching threshold (0.1-0.3V range) of any Si based layer active circuit elements.
3. Extremely simple circuit architecture using only inverters, integrated diode tree, and pass transistors.
4. Reduces total transistor counts, gate counts, and wiring distances in a chip.
5. Built-in zero power control scheme. Each cell has a single phase of asynchronous Clock or Enable controls.
6. Nearly zero wake up times. Both the inter and intra circuit nets are of much lower RC time constants (pico second range) due to circuit topology, and reduced size.
7. It is operative for single voltage supplies down to 0.7V, consuming the least amount of AC power.
8. Supporting concurrently static CMOS-TTL and dynamic DTL circuit interfaces.

With the extension of MLC Flash array and SFPGA constructs, it further:

1. Provides both volatile and nonvolatile logic circuitries.
2. Provides direct analog-digital bi-directional signal translations.
3. Provides exceptional logic and memory capacity and RAS capability.

The SCL units can be operated with single supplies; and with ladder supply multipliers, it supports a broad range of reference voltages. Circuits are described pertaining to VCC for the next few generations below present 1.8V (1.2, 0.9V) systems. The product applications may span from storage disks, multimedia cards, RF signal processors, to graphics and display, and fully buffered DIMM for laptop, PC, phone, camera, and many hand held computing devices.

The power saving feature alone is significant enough for many applications. Each reduction of 70% VCC is seeing 50% power savings alone if all other parameters hold the same. The real situation is that the device will realize spatial savings due to topology simplification and layout rule shrinking, so there are compounded advantages. In later sections, we shall elaborate and explore other potential benefits of SCL in providing high speed clocking, low power, and high density circuit solutions.

The Low Power Universal IC and Intelligent Memory

In conjunction with the referenced patents and the pending patent, it is the goal of the present invention to deploy a system component design paradigm where, in an ideal design library, it may support product designs both as stand alone and embedded IC, analog, logic, and memory (ALM) functional units, and making ASIC with embedded various functional units on one chip, or to extend the module and PCB assemblies including several SoC level chips. It is a cost consideration when one uses the devices, whether in discrete units or advanced SoC chips; the decisions are based on short/long term costs, including the cost in resources and time for the technological development, engineering team, sales force, and system maintenances, pre and after sales supports, etc.

The low power feature is a significant attribute for an SPLL/SDLL type of integrated part. There is an SPLL/SDLL circuit to every processor or emerging intelligent memory chip. For instance, in, the U.S. Patent Application 20050248365, Ser. No. 10/841,934, entitled "Distributive Computing Subsystem of Generic IC Parts", a PCB subsystem is proposed comprising memory intensive chips. Each memory chip will apply the SPLL function, integrate it and incorporate other reconfigurations in order to form an intelligent memory part. There is an option that the function of a local controller chip in a PCB subassembly is eliminated or replaced by the distributed processing power by the entire intelligent memory chips. Hence, the PCB subsystem may be a single or multiple smart memory chips.

The emphasis, however, is to promote the newly defined design platform of mixed signal Analog, Logic, and Memory (ALM) chips which may emerge as a new types of Universal IC (UIC) for the $5^{th}$ generation IC practice supporting low power applications. Under the UIC environment, signals of various voltage levels coexist and interface with each other directly or with suitable level shifters. In many cases, bus wires and nodes may carry multiple (triple or quadruple levels) signals to increase the data process bandwidth in blocks and sub-systems. In another case, same signals may appear in multiple copies, each communicating with a specific group of local blocks. An example is the case of SCL register unit, where SCL gate meets simple (2-way) CMOS-TTL latches, wherein both sets of signals are useful to SCL and TTL blocks.

Figure 11:
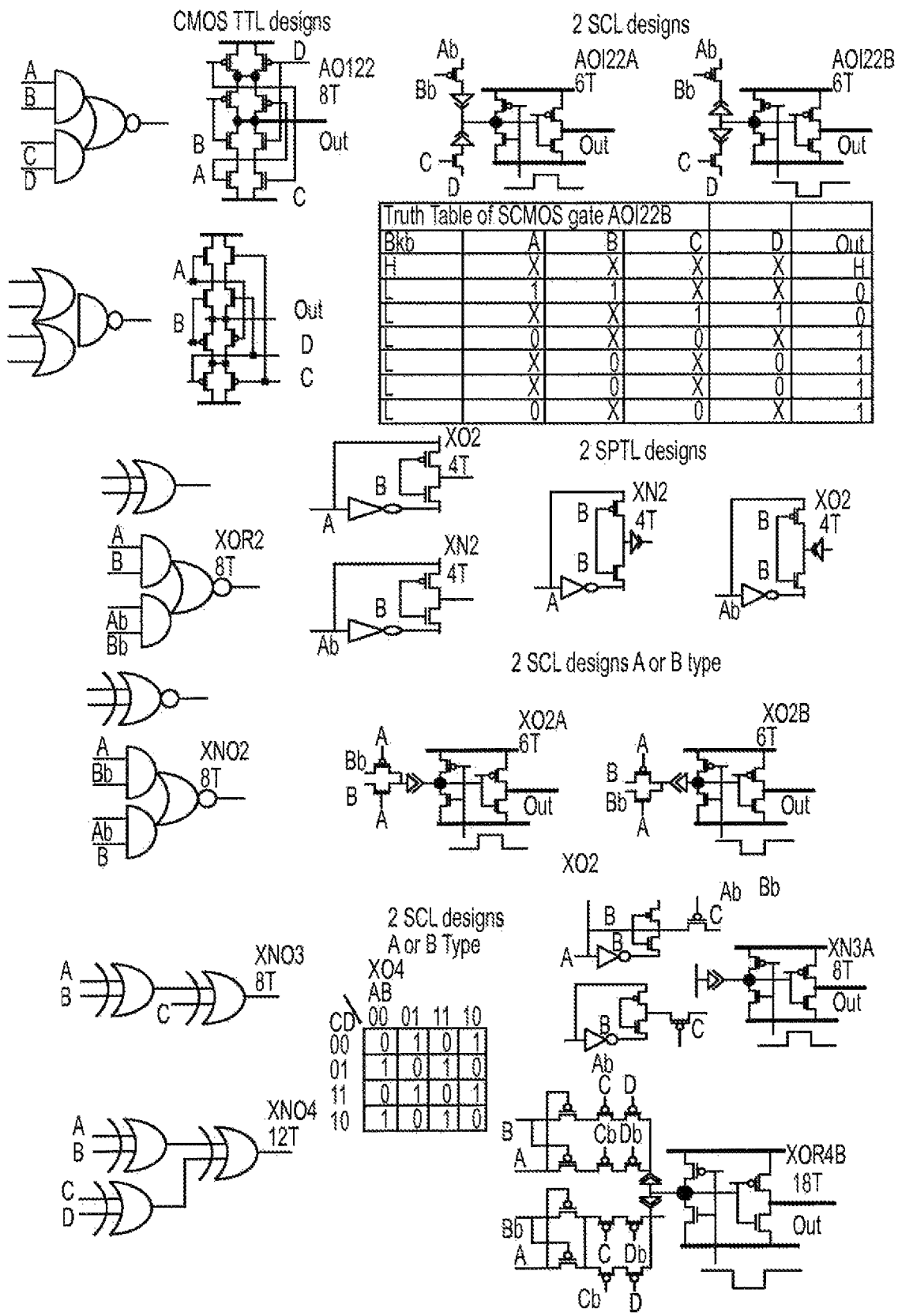
FIG. 11 shows the examples of the SBD-pass transistor logic (SPTL).
Figure 20:
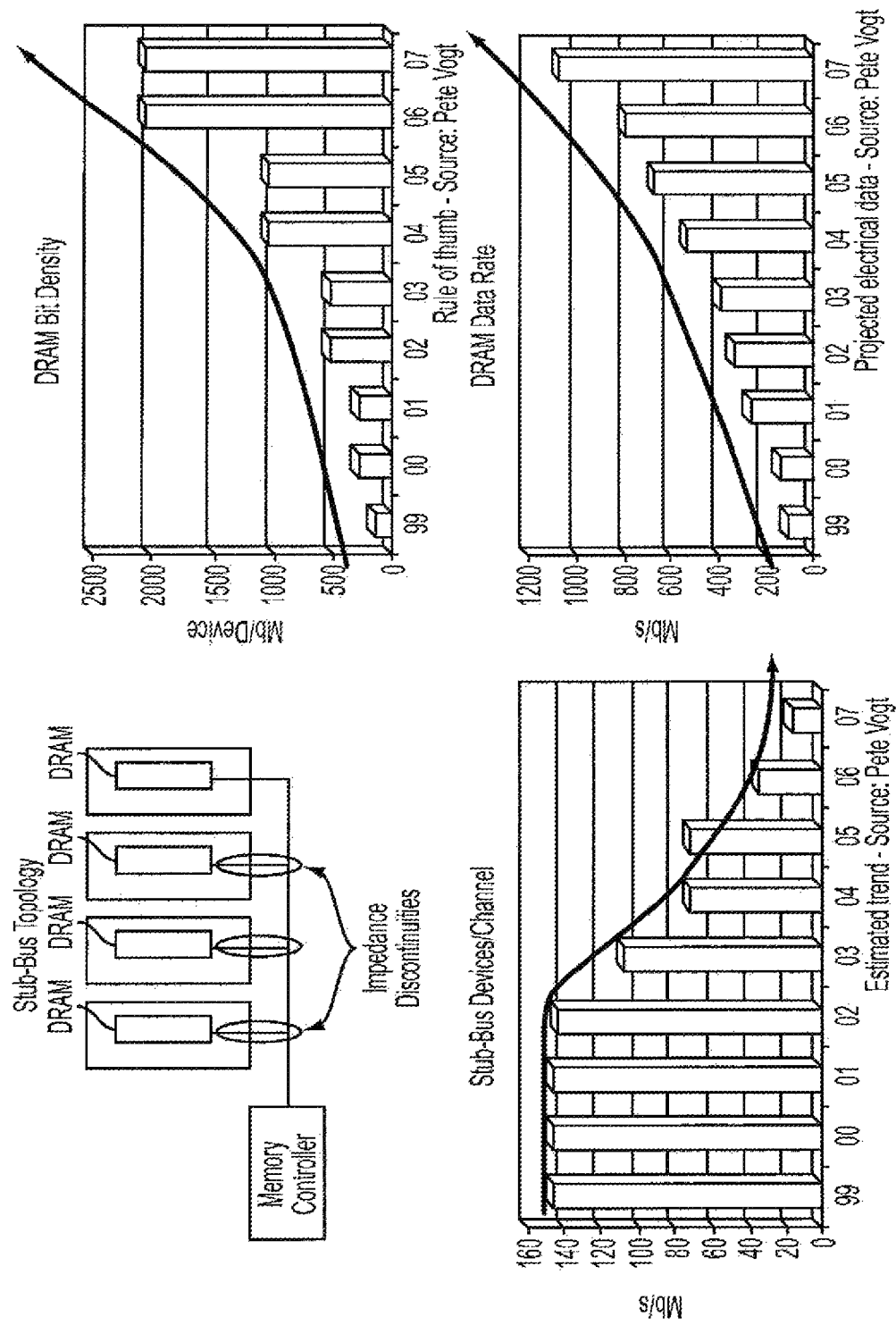
FIG. 20 proposes the SCL type peripherals for the DRAM chips and controller chip sets.
Figure 20:
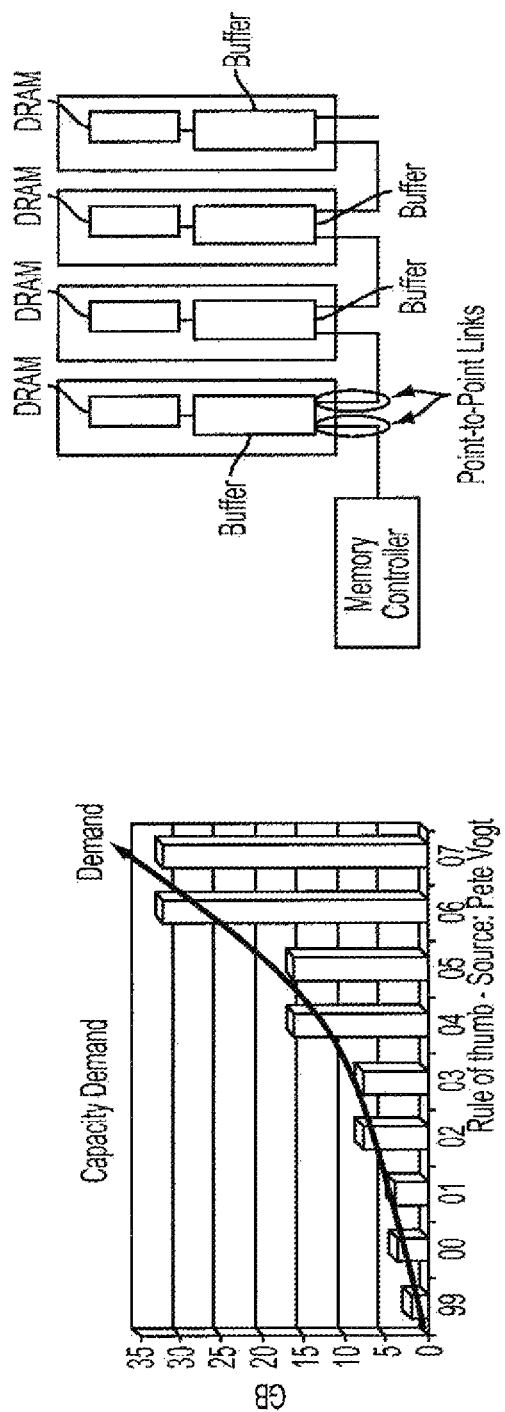
Figure 20:
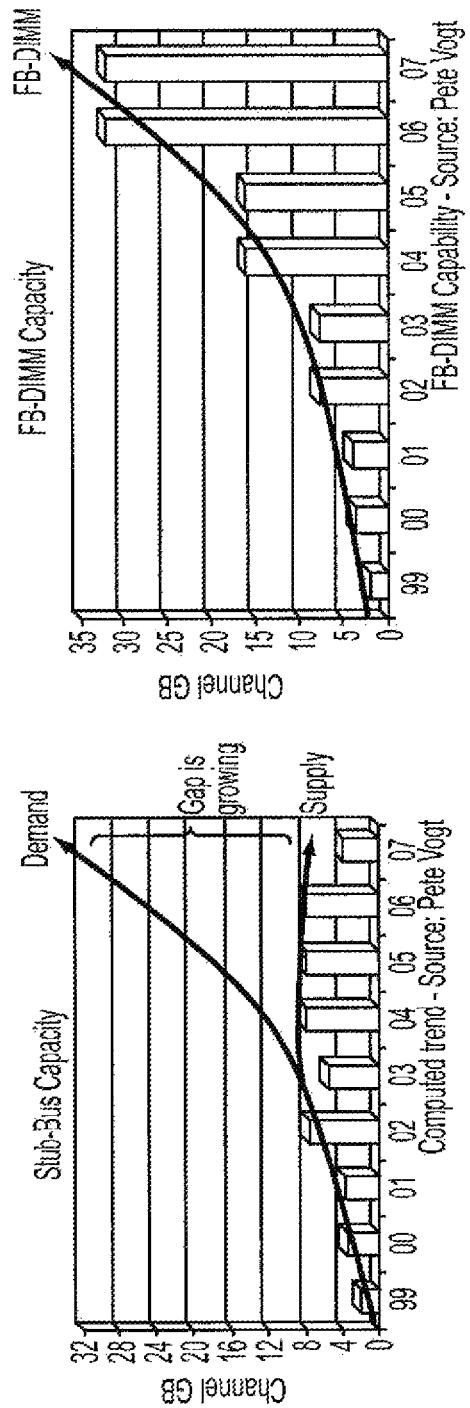

Another object of UIC is to equip the memory intensive commodity chips with simple intelligence to support clocking and termination options. These options, as shown in FIGS. 10, 11, and 20, may be accommodated via simple SFPGA and other schemes. The added reconfiguring capability to selected portions of the chip not only improves the capacity of each chip, but eliminates the traditional boundary of analog, logic and memory commodities, therefore greatly enhancing RAS values and reduces initial costs of the system, as well as the cost of post sale maintenance and services.

The SPLL/SDLL blocks are essential functional units serving timing critical operations among local and inter-chip buses. Many prior art circuits are reexamined, remapped, or reinvented simply for continuity reasons or to make significant improvements in certain aspects of figures of merits. Still many SCL type new circuit configurations in phase detection, shifting, delay controls, frequency syntheses, waveform-combining techniques (FIG. 19a-19g) are newly proposed with exceptional performances.

In FIG. 1a-1d, we see that the CMOS devices evolve better and better since the 3-D shrinking of transistors. The performance gains between the BJT and MOST are due to structures and physics. The difference in gaps is enlarged as the basic feature sizes are getting smaller and as more contacts are included into the transistors in macro constructs. These points carry forward to the SCMOS structures shown elsewhere. One can see that the CMOS transistors are bulky and the SBD-CMOST integrated elements are physically and electrically more efficient.

GaAs and SiGe technology also got a lot of attention as the next generation candidates for high-speed IC solutions. However, the cost factor stays unfavorable because of the low device yield, and high power circuit, operations due to the bipolar transistors. If SCMOS implementation is developed, every respect for future VLSI applications will be improved. FIG. 1e illustrates this comparison.

Figure 2:
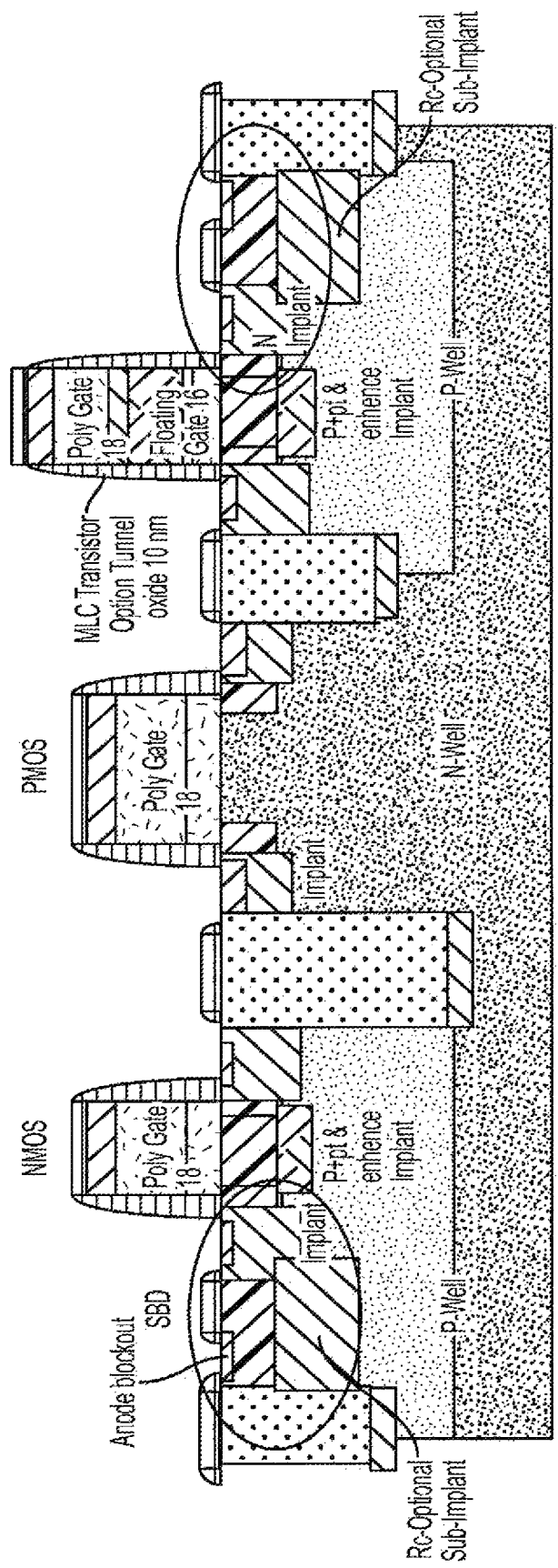
FIG. 2 illustrates the cross sectional views of the integrated SBD and CMOS transistors including Flash devices.

In FIG. 2, we showed the SBD and NMOST, SBD and FlashT cross-sectional views. The P-type transistor implementation was also successful. This makes it clear that complementary SBD can be integrated with all typos of Bipolar, CMOS, and Flash transistors, and hence FIG. 3a-3c illustrates conceptual difference between the two types of MOS device implementations.

It appeared as if the circuit comparisons were between a CMOS dynamic cell and a CMOS static cell. But one can see that if the A input of the CMOS TTL were driven by a dynamic pulse, the circuit would turn into a domino circuit with a feedback pull-up transistor Tpfb added, so the example illustrates comparisons of the dynamic circuit operation between the SCL and TTL configurations. Here the SCMOS compactness was better than 2:1 (243 $F^2$:105 $F^2$), the power saving was greater than 4:1, and speed was better than 2:1. An averaged performance matrix gain showed 16 fold or better. One can bear in mind that SCMOS macros contain all simple CMOS static gates; any CMOS implementations less than 2 way inputs are recommended to stay.

Figure 4:
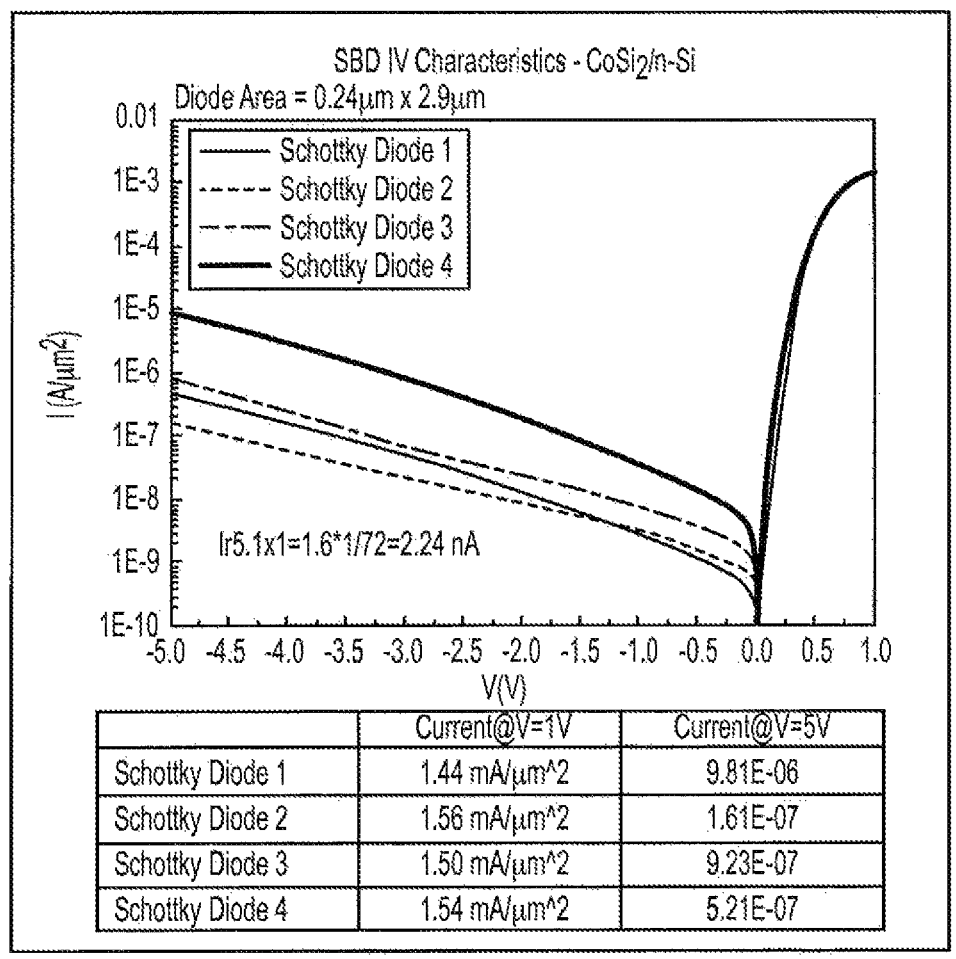
FIG. 4 shows the initial forward and reverse I-V data points of the LtSBD test wafers from TSMC lab. MROM chip capacity was projected.

FIG. 4 shows the full range of typical N/P type SBD data points. The low power diode operations are in uA and 0.1 V, and, the breakdown can be controlled at 2 nA and VR=5V. With the 90 nm rules and 0.9 array ratio, one can support a low cost NV controller chip operable at Giga Htz clock, and Mask ROM of 256 MB.

FIGS. 5 and 7a through 7f reviewed the terrestrial solar energy spectrum. It showed that solar conversion was using GaAs, and PN Si/A-Si systems having exited bands of 1.8, 1.4, and 1.1 ev respectively. Yang et al described comprehensively current solar cells with manufacturing processes involving low cost A-Si:H and A-SiGe:H double-junction cells, Ag/ZnO alloy thin films on stainless steel (SS) panels. The conversion energy gaps were 1.75 and 1.45 eV, the conversion efficiency was ~11%.

Figure 5A:
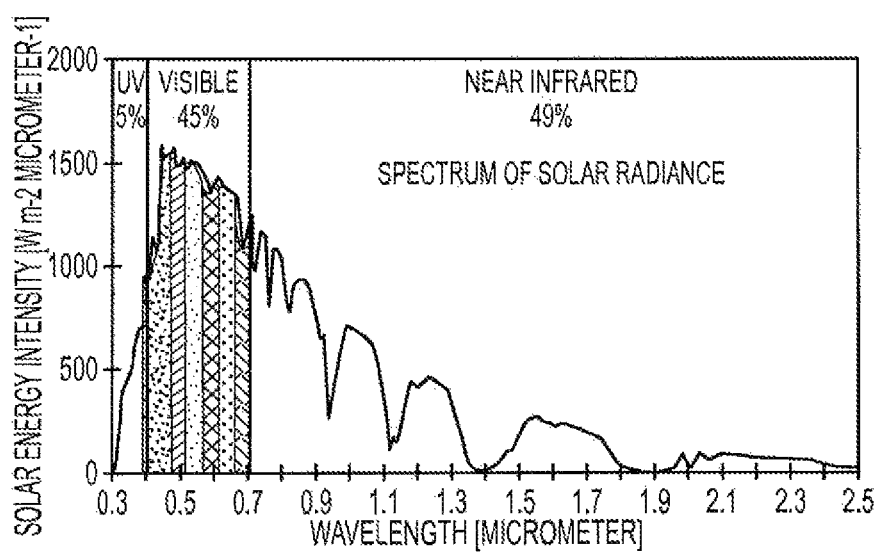
FIG. 5a-5b shows the solar energy intensity spectrum and the band gaps, from GaAs to SiGe, and Si PN junction, of the Photon-Voltaic materials in tandem.
Figure 5B:
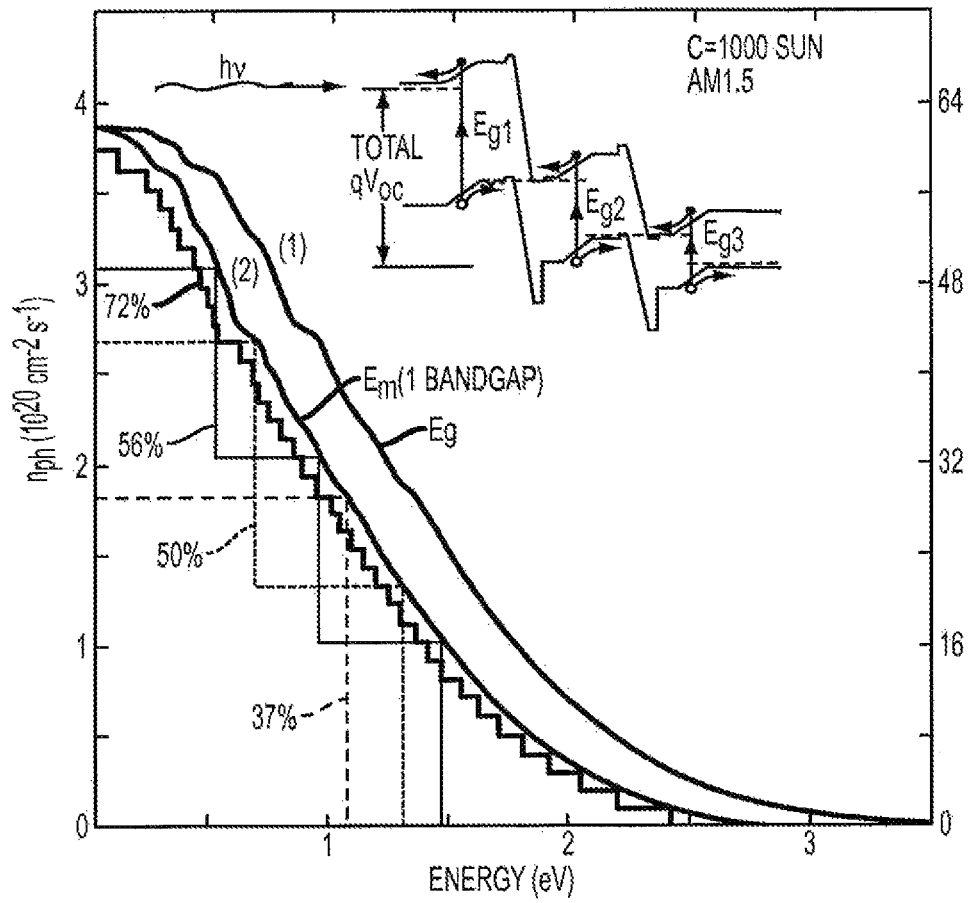
Figure 6:
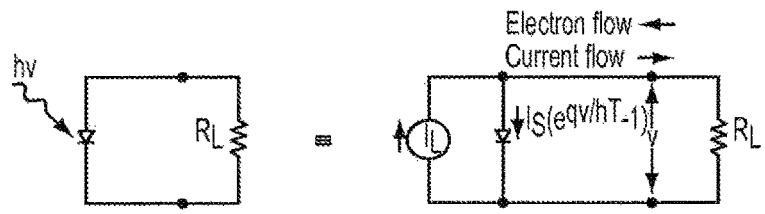
FIG. 6 depicts the Photon-Voltaic circuit model and band charts of the LtSBD devices.
Figure 6:
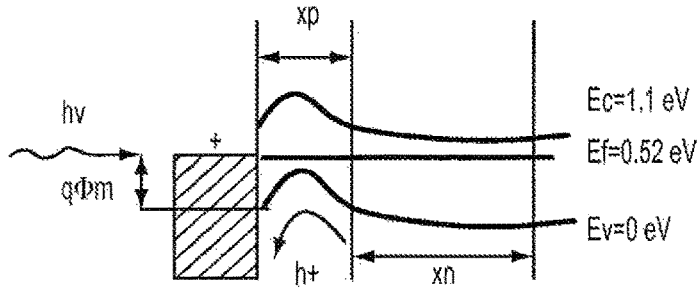
Figure 6:
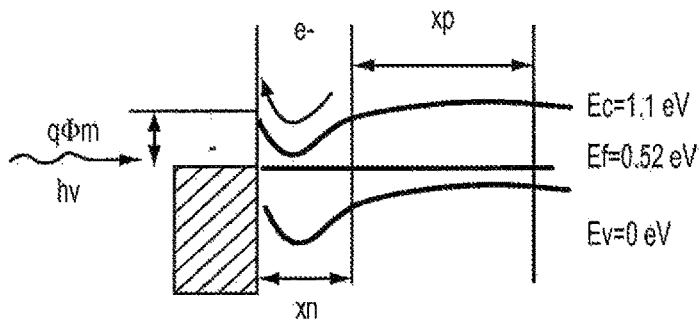
Figure 7A:
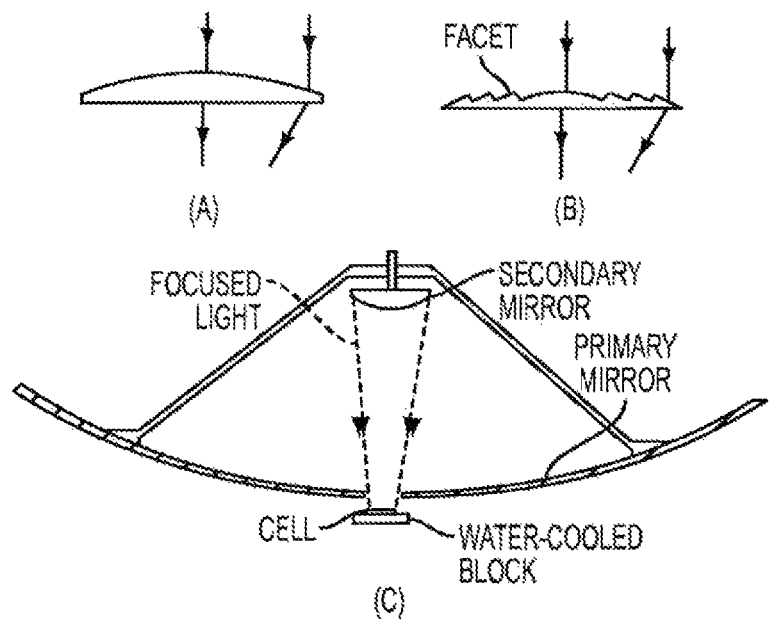
FIG. 7*a*-7*f* shows the prior arts of a solar concentrator apparatus that can be employed for the current invention.
Figure 7B:
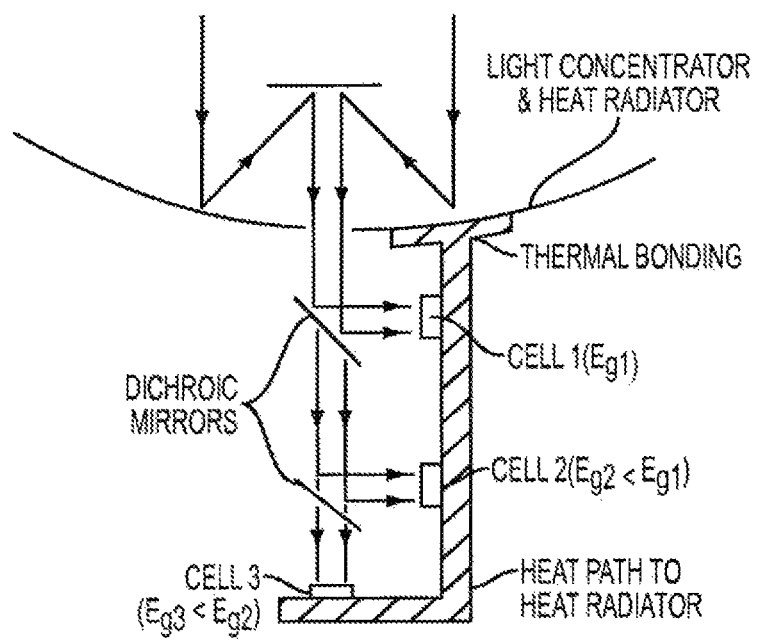
Figure 7C:
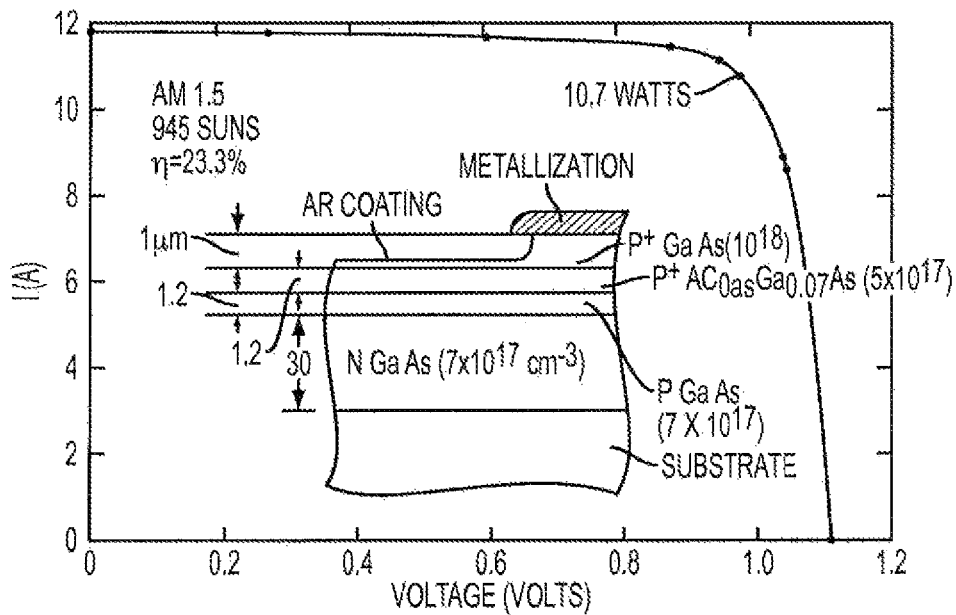
Figure 7D:
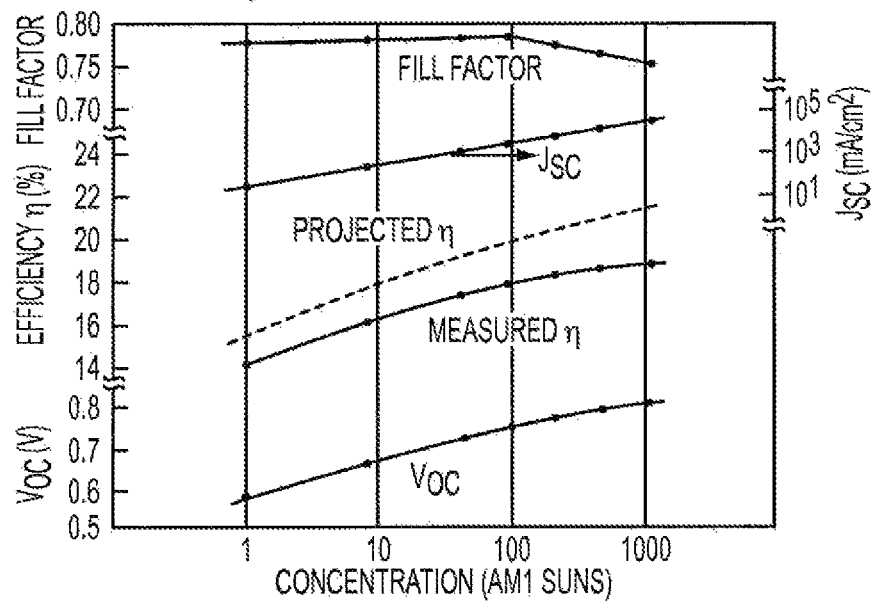
Figure 7E:
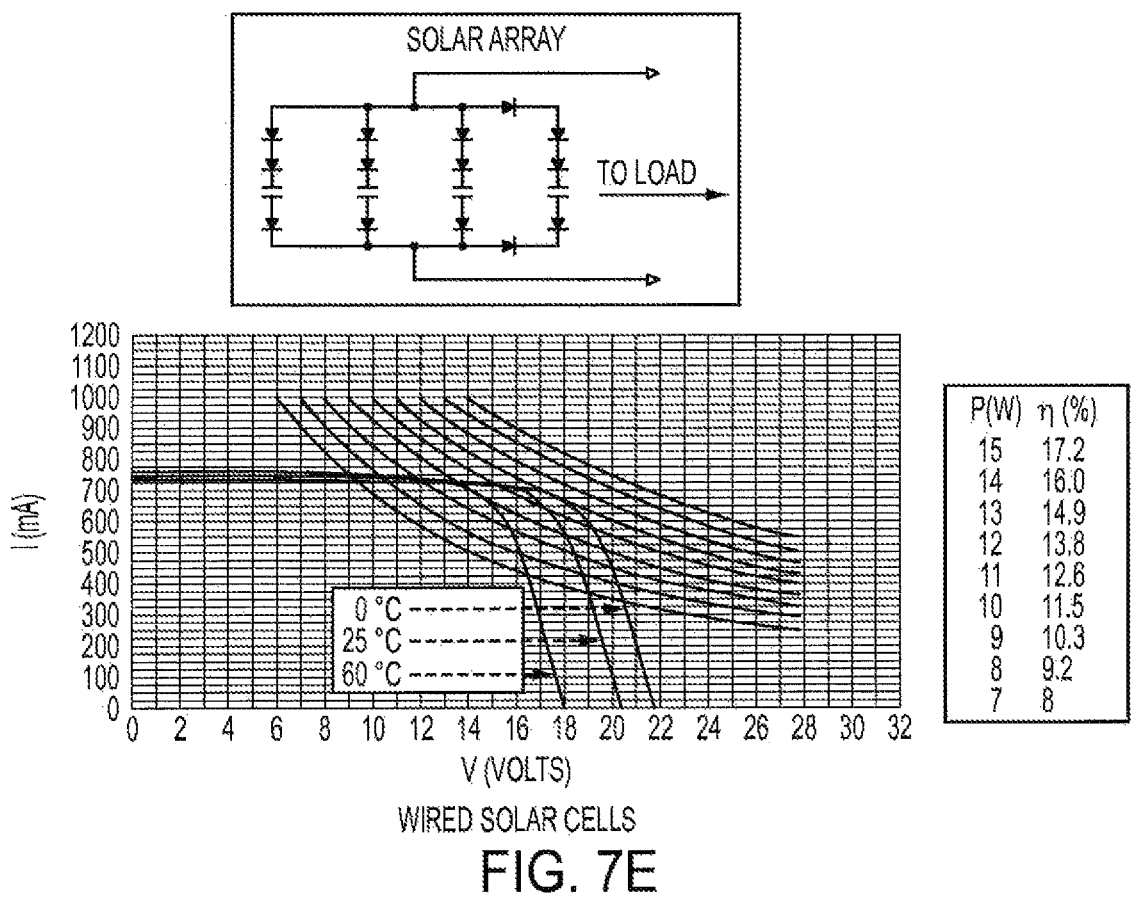
Figure 7F:
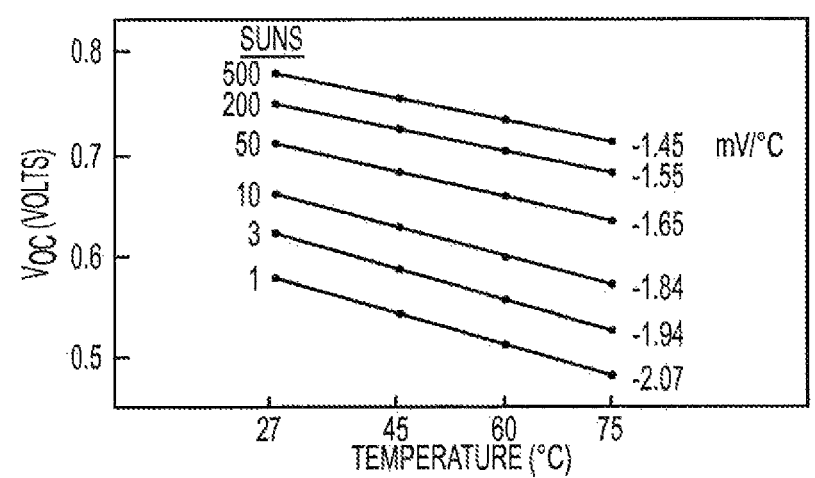
Figure 8A:
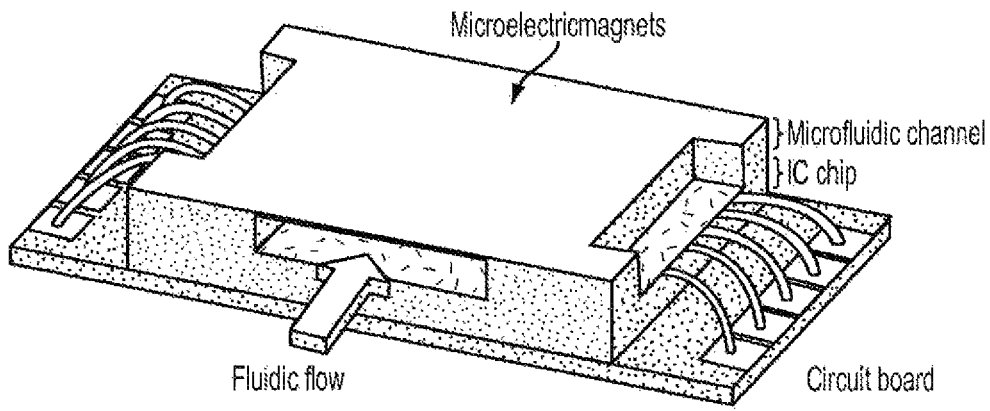
FIG. 8*a*-8*d* shows the current art of the bio-lab chips utilizing electro-magnetic forces for life science and medical research. Low power SCMOS chips are proposed.
Figure 8B:
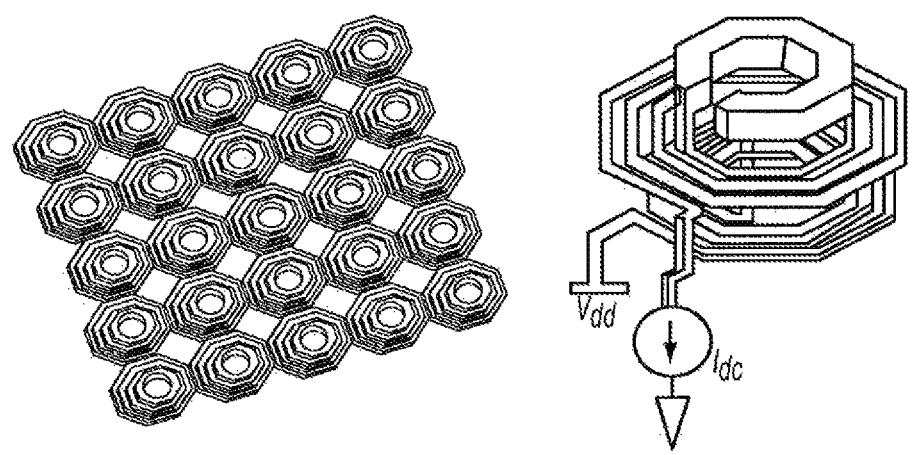
Figure 8C:
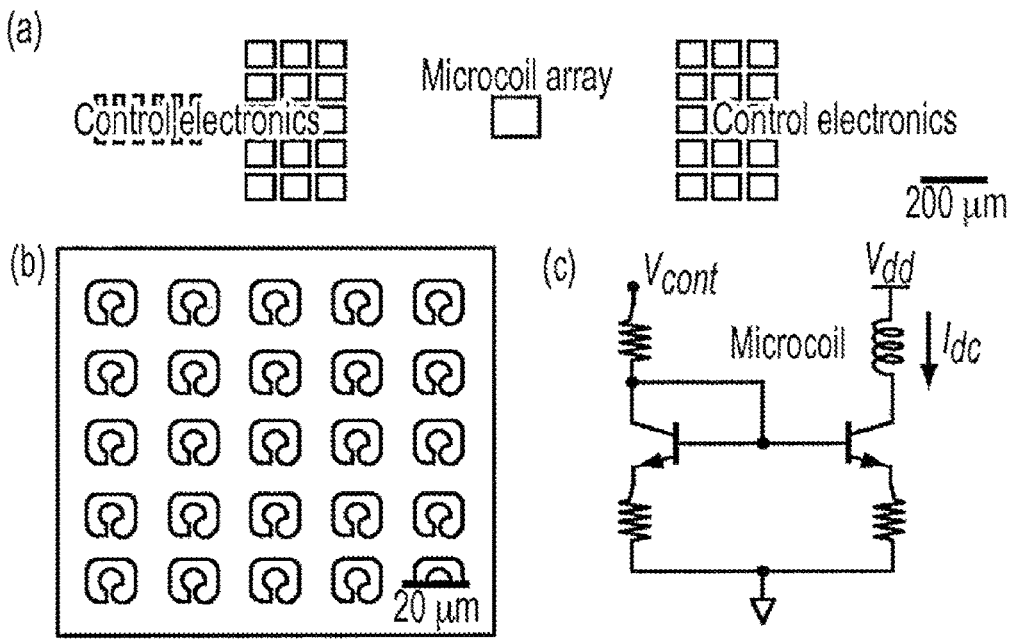
Figure 8D:
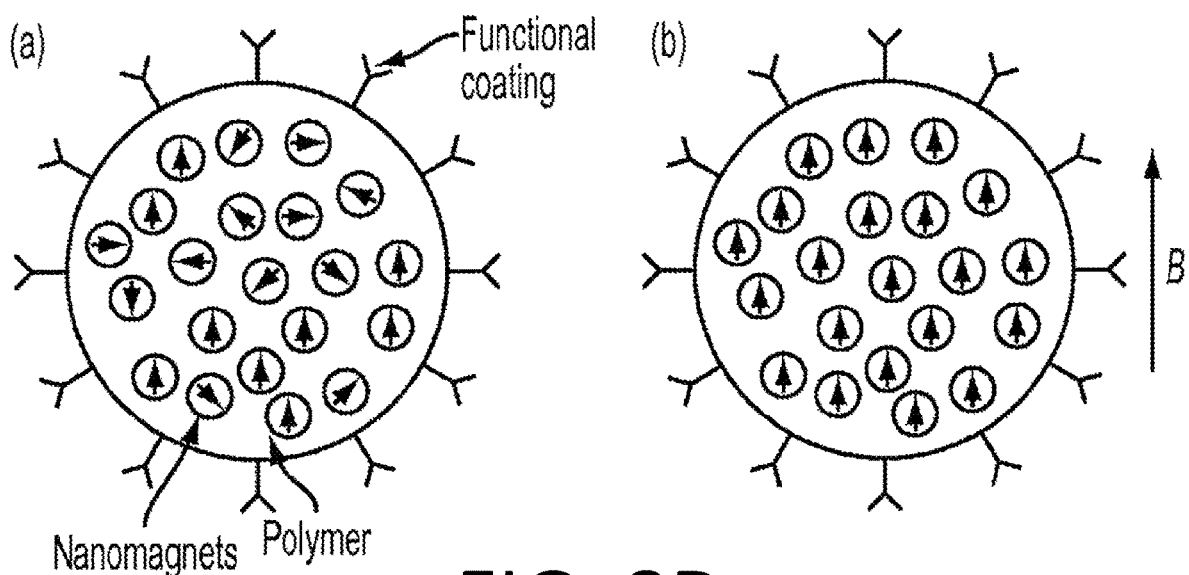
Figure 9A:
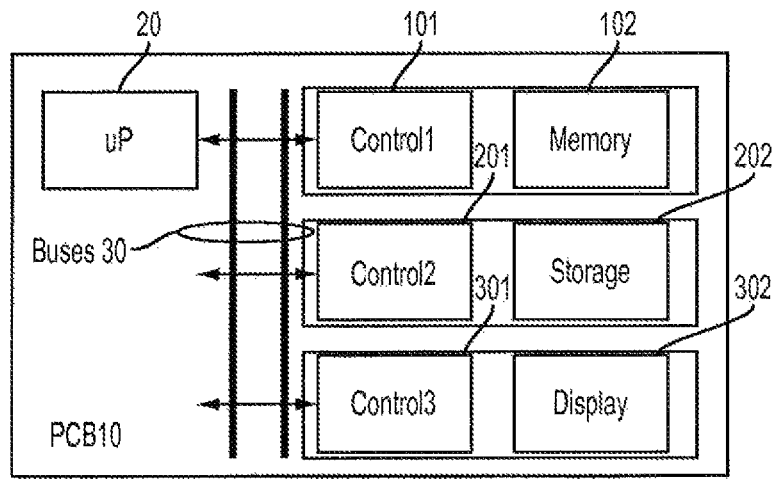
FIG. 9*a*-9*g* updates the proposed SCMOS techniques for field programming distributed chip blocks and wiring schemes in a PCB/modules environment.
Figure 9B:
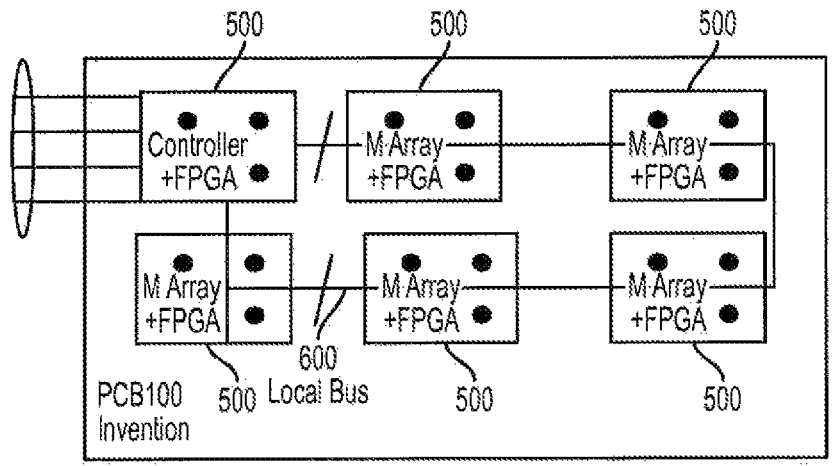
Figure 9C:
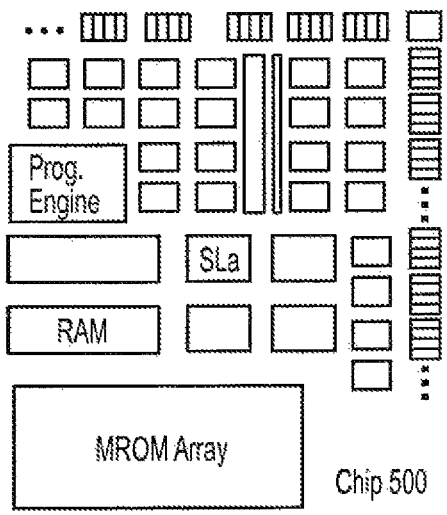
Figure 9D:
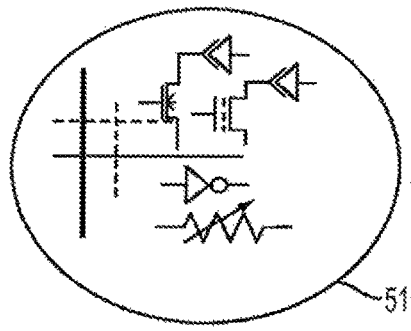
Figure 9E:
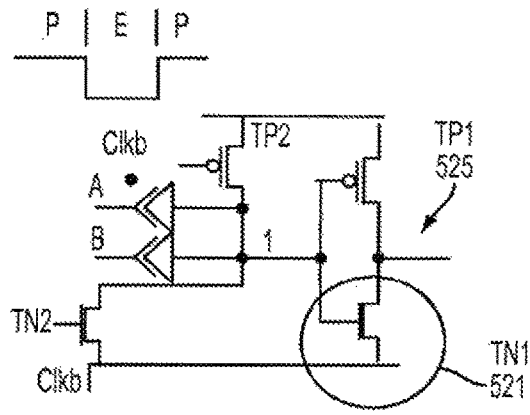
Figure 9F:
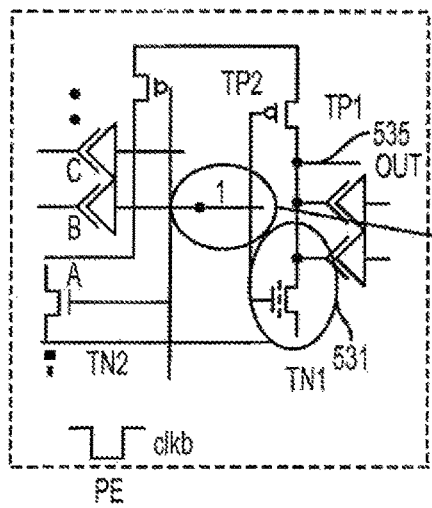
Figure 9G:
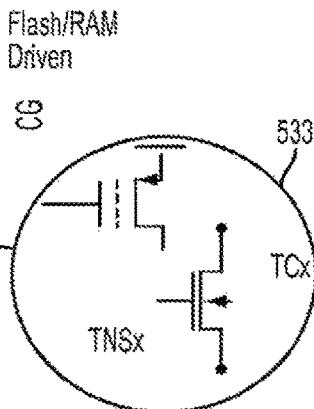
Figure 9G:
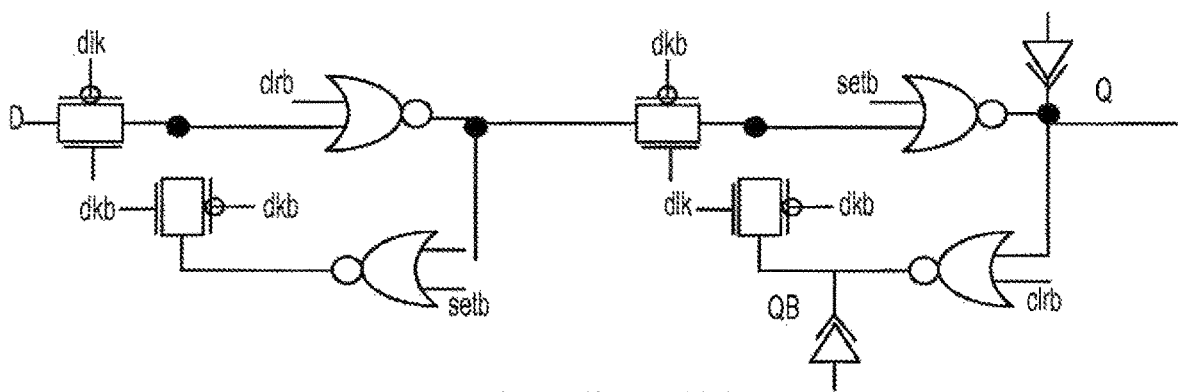

FIG. 5a illustrates multi-junction solar cells reported by Yang et al.

Through the introduction of the Co/Ti metal Si compounds, prior systems can be modified, the Si/metal subsystem can be improved with additional in far-red region energy conversions of the 1.1, 0.7, 0.52 eV modes of PV current components. It is believed that the amorphous Si (A-Si) may have a PV effect with certain thin film layers including S, In, Se, Tin, and Co, Ti metals. Solar cells may be formed as shown in FIG. 7a-7f, views 1-5, or in flat panel with glass, stainless steel, layers, polyimade and reflective layers; poly Si crystal films may form various solar cells in tandem and parallel strings, and they may be wired by Si/metal wiring tracks using SCMOS based HW/SW constructs.

FIG. 8a-8d illustrates the life science and medical research work conducted by Harvard scientists. It was inspirational that the low powered IC devices can be useful for this new field of extreme importance to human sciences. The inductive coils were considered too bulky to incorporate onto the chip. The Harvard paper cited an important case to use the IC and mini coils to navigate bio-cell motions in micro-meter dimensions. The dynamic low power circuit was an ideal application to operate bio-cells with the least heat effects.

FIG. 9a-9g updated the SCMOS/CMOS circuit applications to the field programmable devices in PCB or module subsystems. The SCMOS HW/SW devices may be deployed to lower the cost of subsystem in performances, the bill of materials and manufacturing methods, inventory management, system maintenance, field engineering support and service changes.

FIG. 10a-10e shows the cross sectional circuit and, layout views of the nonvolatile memory core for the SoC chip sets. The macros include SCL peripherals of address buffers, decoders, SBD array core, sense amplifier and latch, internal and chip interface blocks.

In accordance with FIG. 10c, all buffers are implemented by SCL with complementary SBDs. All macros are determined such that the biasing conditions related to adjacent blocks assures that the diodes and or transistors are subject to zero-stressed conditions in their quiescent states. While the static logic gate does not assure the biasing conditions between adjacent circuit elements, there is one unique benefit offered only by the SCL dynamic circuits. For instance, there are 1024 NOR word-line decoders, each containing 10 way diodes. In the pre-charged conditions, the internal nodes of the decoders are biased at VH, this is also true that all of their diode inputs are set at VH by using ckb driven Buffer A. Hence all the decoder diodes are zero stressed.

Accordingly, the bit-line decoders are using NAND gates and buffer B are used to deliver GND level in quiescent state, so that all diodes there are zero-stressed. Finally, the quiescent word lines and bit lines are in 0V, so in the array core, millions of array diodes are kept at zero-stress conditions there in a quiescent state. When the WL was selected, it raised to VH level, then each of the bit lines are let go during the WL and the BL decode window. After the selected bit line resumes to its unselected mode, the activated BL then seeks to low state by one diode drop below the VH of the selected L. By the diode offset of the sensing amplifier, the latch should sense the VH level if the array diode presents.

Figure 18A:
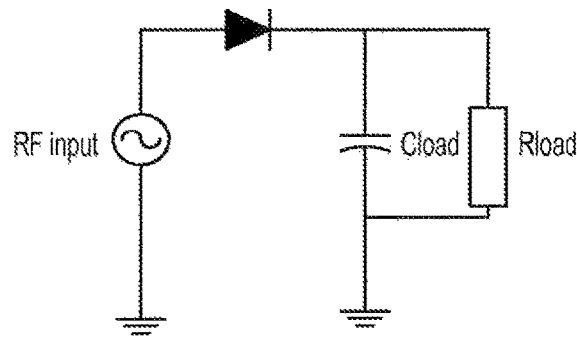
FIG. 18*a*-18*f* shows the RFID circuit implementation comparison between MOS transistor based diode rectifier and the SBD based rectifiers.
Figure 18B:
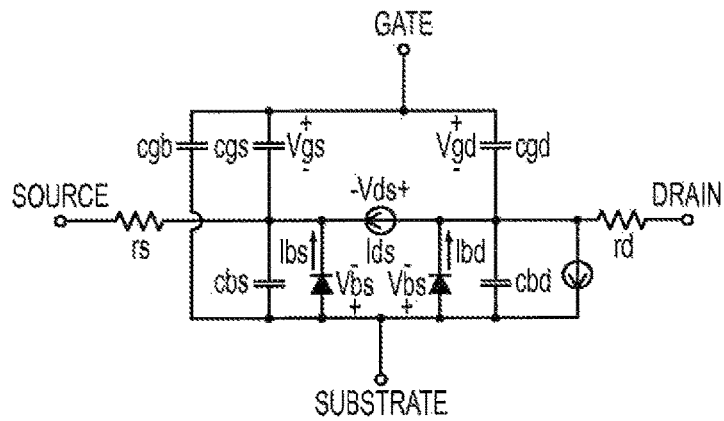
Figure 18C:
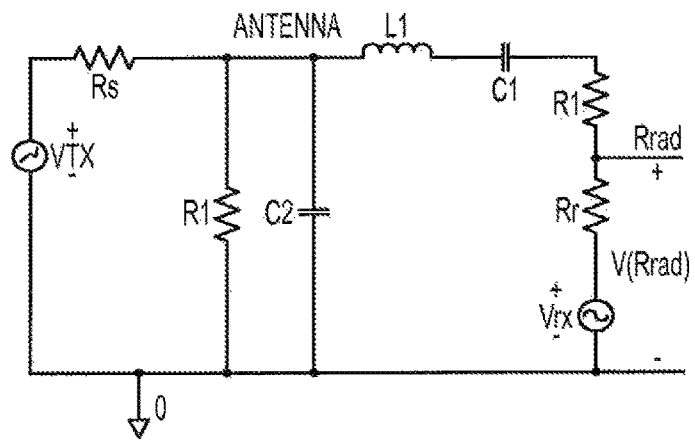
Figure 18D:
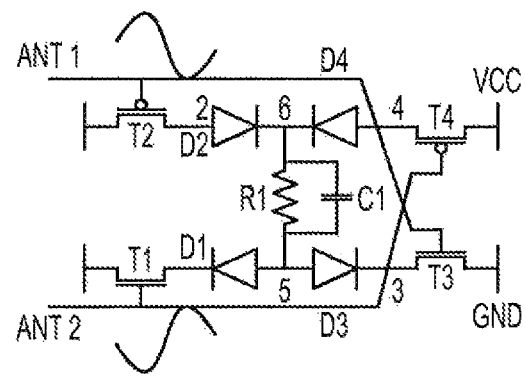
Figure 18E:
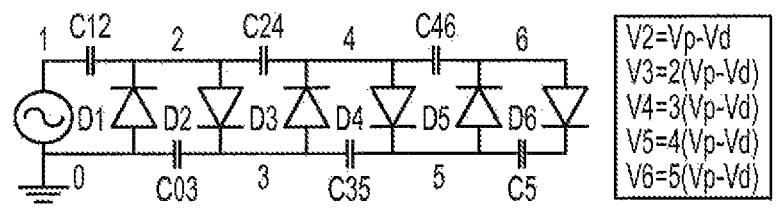

FIG. 18e summarizes the timing diagram of the signals.

The distinct advantages of the world's fastest NV memory offered are:

Extremely compact peripheral and core sizes. Density is 4 $F^2$ per bit.

Fastest on chip NV memory of any known memories. These memories work with under nS cycle times, and they work seamlessly with fast logic gates, as well as OS control and code stores.

Low cost logic process with transistor and 2 metals.

Extremely power saving, for appliances, cell phones, games and handheld machines.

Excellent device yield by die size and 0-stressed components.

FIG. 11 prescribes the Schottky diode and pass transistor logic (SPTL) macros for compact and high performance logic functions. The Schottky diode and pass transistor logic implement complex functions by the diode CMOS transistor pairs.

FIGS. 12 and 13 summarizes the design and process trend following BJT and CMOST for the past fifty years. The timing focuses on a new circuit technology for ALM device implementations. The SCMOS techniques shall become the main stream solution to extend Moore's law, and overhaul all Si product lines, porting to Si devices from 4 IN to 15 IN wafers. The expanded applications go beyond computers to solar energy conversions, mixed fuel and electric engines, life science and medical equipment.

Figure 14A:
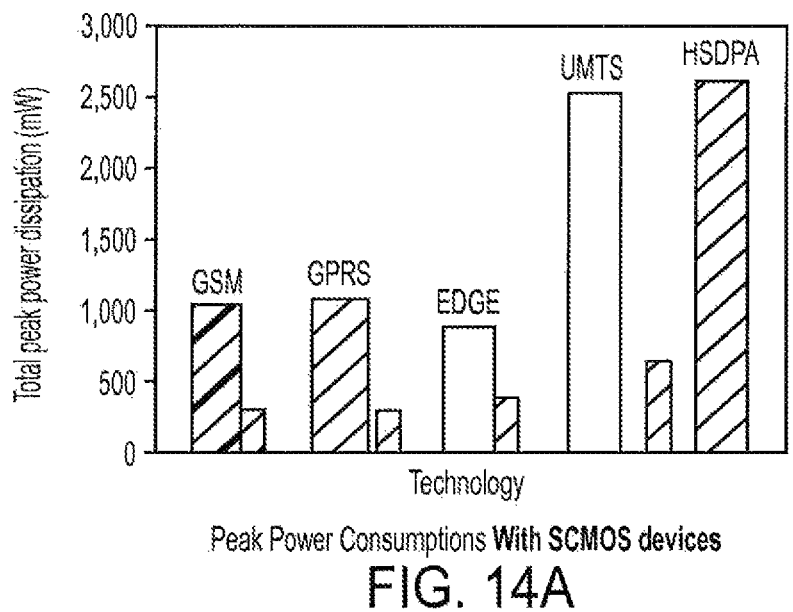
FIG. 14*a*-14*b* shows power consumption sources of a CMOS state-of-the-arts cell phone chip set system.
Figure 14B:
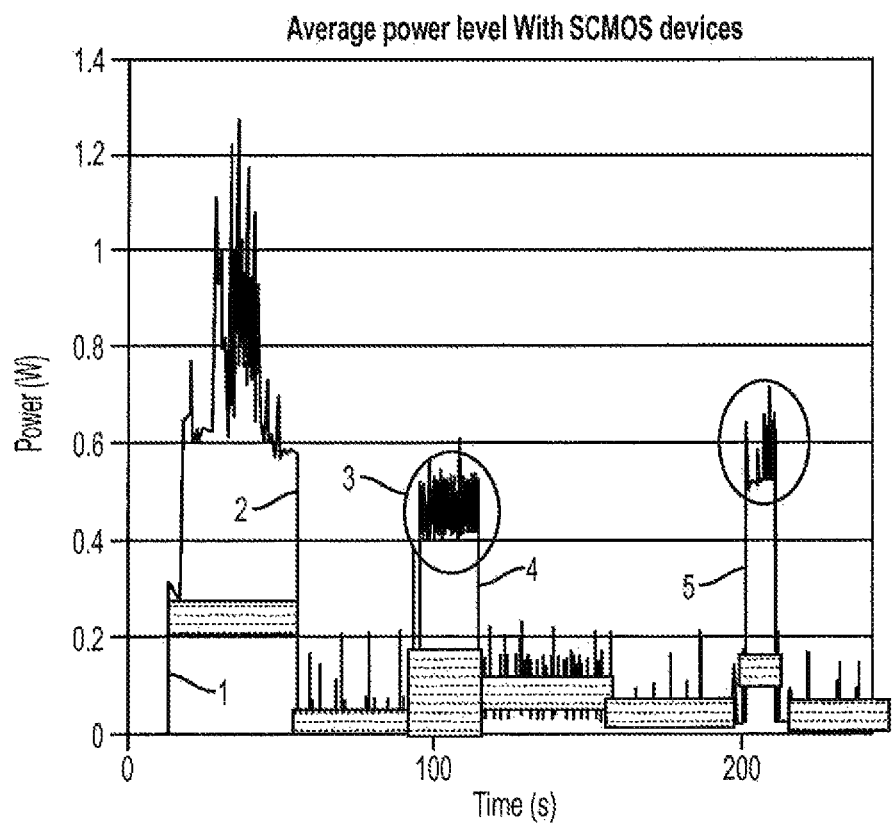

FIG. 14a-14b showed what the current state of the art offers when in operation with cell phone devices. What, then, are the power allocations in mobile phone data transactions? The main power consumption activities are:

1. Turn power on—keypad and LCD backlights go on—search for network—welcome.
2. Keypad backlights go off—display goes dark.
3. Display goes on but keypad backlights stay off.
4. Display goes blank.
5. Close flip external display backlight on. Main power consumption tasks are on-line protocol hand shaking, key board and data accessing, display processing, and filing saving. The 1 W peaking power is a burden for battery backup operations. These days, travelers are grabbing power outlets in many different places to charge their mobile PC and cell phone units.

SCMOS uses lower VCC, LtSBD switches, and changes to SCL circuit configuration. It uses class D pulse width modulation (PWM) I²C V2_3.4 Mbps, and USB2+ protocol for audio, video and RF signal processing. Faster local data transactions and lower signal swings will curtail average power under 4:1 ratio from VCC=2.5V to 1.25V and/or lower. Furthermore, there was a ladder charger circuit disclosed for switching power supply systems.

Figure 15A:
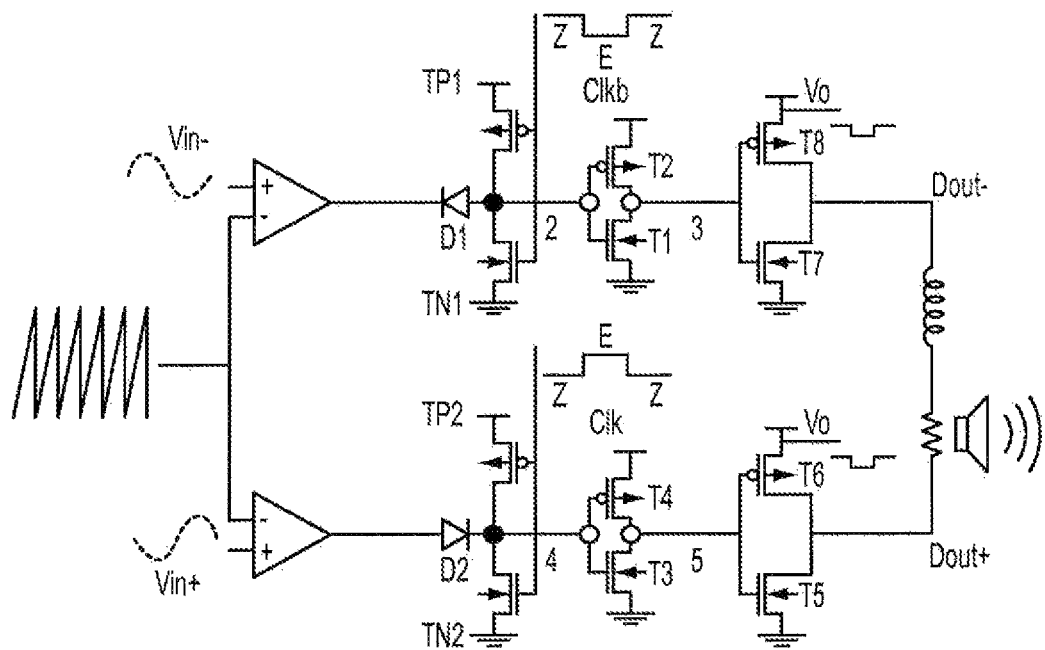
FIG. 15*a*-15*b* shows the SCMOS implementation of a bridge-tied load BTL D amplifier design.
Figure 15B:
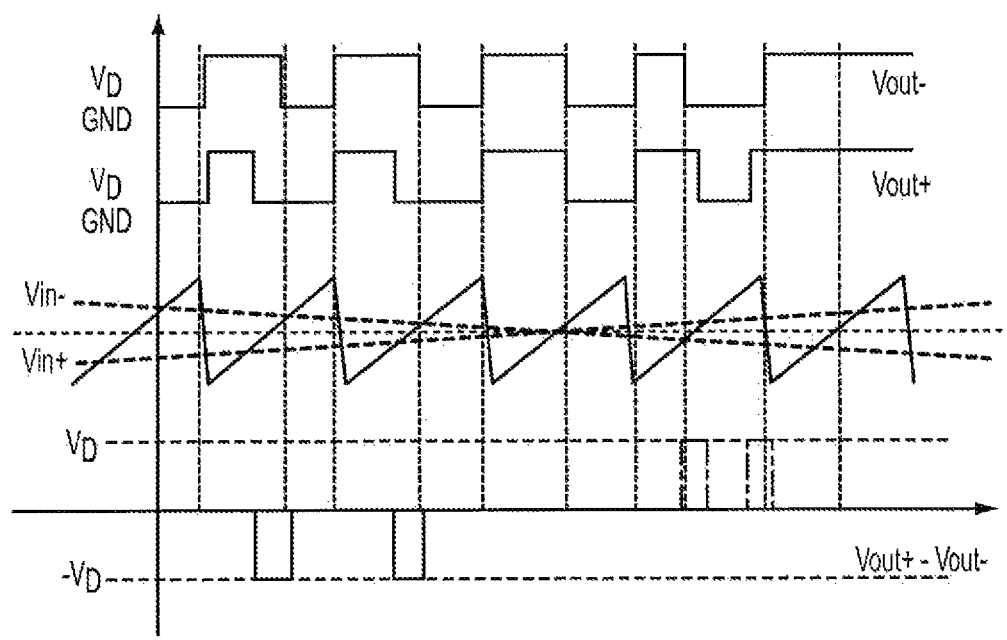

FIG. 15a-FIG. 15b shows the SCMOS implementation of a bridge-tied load BTL D amplifier design. The BTL features the best audio quality, strong drive of loads, and at lowest cost. Complementary audio signals are modulated by pulse width modulated saw-tooth wave, the digital signals feed directly by the push-pull gates, which are operated by the same pulse width square clocks. The direct driver feeds the speaker with no filter, no blocking capacitors, and quadruple the voltage/current drives.

Figure 16A:
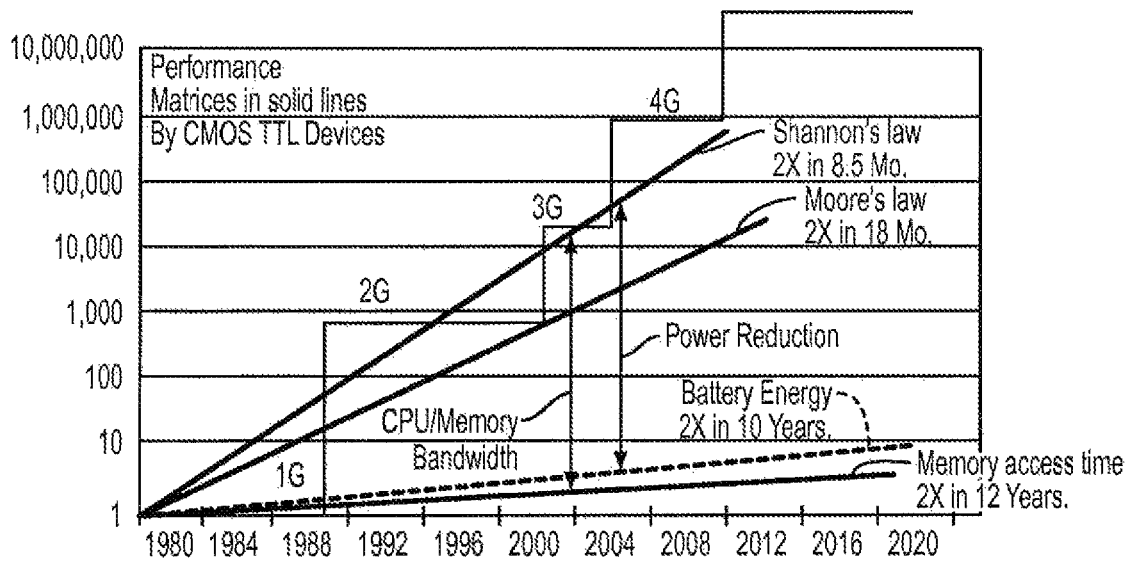
FIG. 16*a*-16*b* compares the performance gaps between various on chip functional units that hinder low power and compact integration.
Figure 16B:
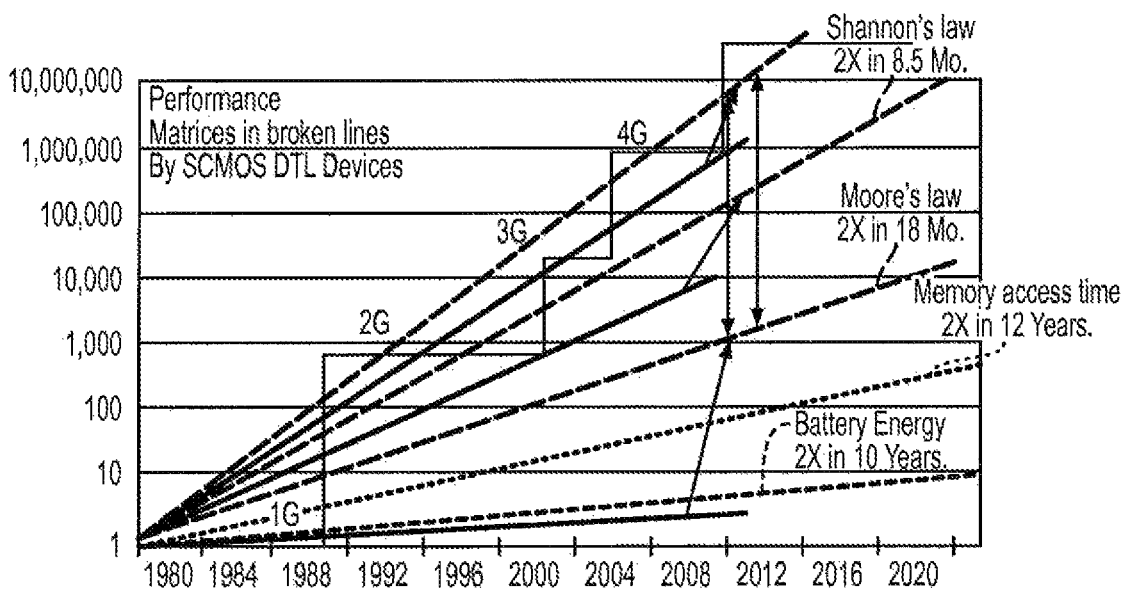
Figure 17A:
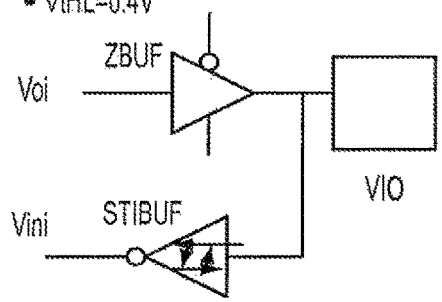
FIG. 17*a*-17*e* shows transistor level designs for the SCL type IO cells, including Hi-Z blocks and Schmitt triggers.
Figure 17B:
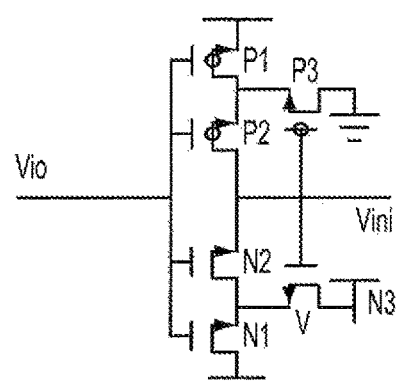
Figure 17C:
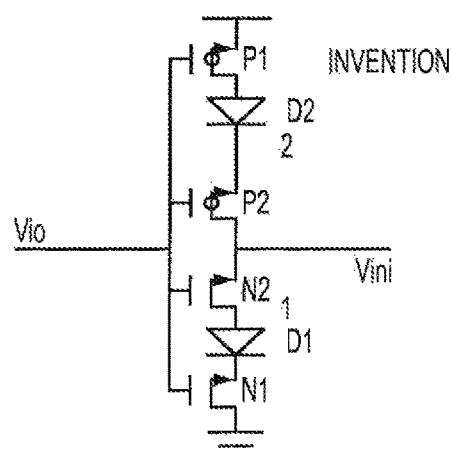
Figure 17D:
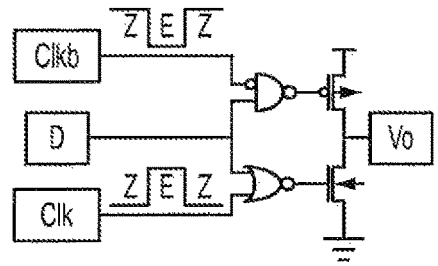
Figure 17E:
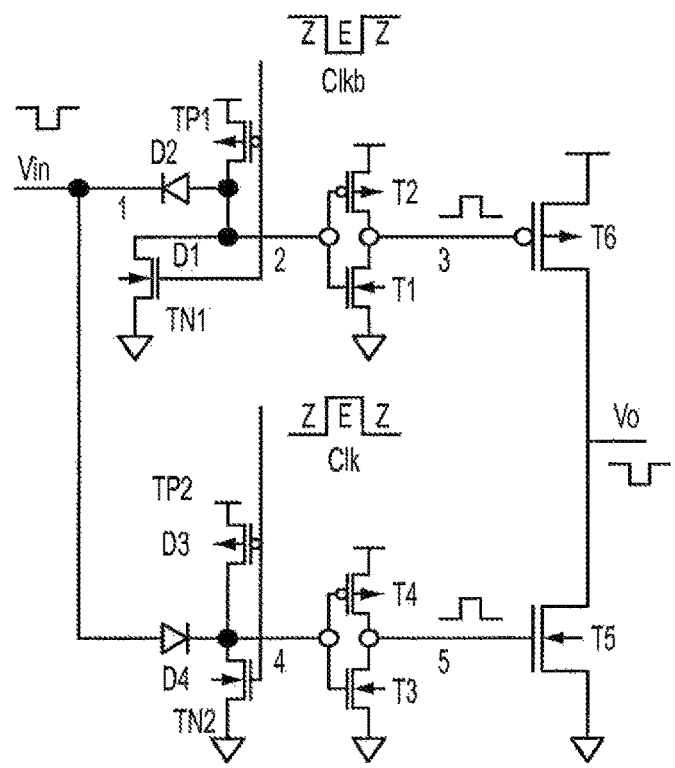

FIG. 16a-FIG. 16b reviewed the present cell phone art of the CMOS TTL devices. It showed severe gaps between the RAM, storage memories and the logic units. Applying SCMOS chip overhauls is proposed, and employing SCMOS ALM blocks elsewhere in the system chip sets. Before 2010, the memory blocks are all significantly advanced to Giga-Htz operations. Chip performances are not only upgraded, but they also greatly enhance, the switching power systems and battery recharging systems. A new era of low power and energy efficient microelectronics has been created. Solar energy creation, solar engines, life science and medical research can improve human lives by staying with Hi-Tech.

FIG. 17a-17e disclosed two IO cells used by SCMOS chips. The Hi-Z Buffer and the Schmitt trigger are important to interface high capacitive bus lines at chip or internal wires. In the Schmitt trigger input buffer (STIB) the diode D1 and D2 and their series resistances may be implemented to enhance the turn on voltage threshold references.

Figure 18F:
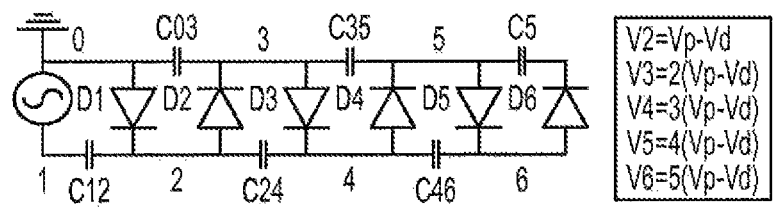

FIG. 18a-FIG. 18f discloses two basic circuit configurations of the bridge diode circuits of an RFID circuit implementation. In both circuits, RF signals are coupled via dipole antennas to MOS input transistors. FIGS. 18a and 18b show where diodes are wired by 3 terminal MOS transistors. In FIGS. 18d, 18e and 18f, however, the SBD was used directly for rectifier operations. One can obviously see the advantages when the bulky PN junction parasitic capacitance was eliminated, because the power conversion efficiency was greatly improved. The SBD version implementation has almost backgate leakage effects, and its forward resistances are orders of magnitude smaller than the MOS channel resistances.

Using a Dipole Antenna Model

Although dipole and monopole antennas are not necessarily the best candidates for UWB antennas, they are easy to manufacture and low cost. The FIG. 18c is the electrical equivalent of a half wavelength dipole antenna presented in "Modeling and Simulation of A Dipole Antenna for UWB Applications using equivalent spice circuits" John F. M. Gerrits, Andreas A. Hutter, Jaouhar Ayadi, John R. Farserotu, Centre Suisse d"Electronique et de Microtechnique SA (CSEM) Neuchatel—Switzerland. The Voltage source VTX and Rs represent the output signals. The Rl stands for the antenna loss resistance. Rr is the radiation resistance of the antenna. The R1, which is 1 Meg ohm, is used for Spice convergence. The C2 is used to improve the performance of the antenna above resonant frequency f0. Since the antenna is a linear network, we can use a voltage source for Vrx to simulate the antenna receive. The input signal level from the MOST version is about 1 V peak-to-peak at 150 uW input power, assuming Cin=1 pF at 915 MHz, Vtd=0.5V. The SBD version shall work with much less input power, and input signal required is about 0.5V, the Vtd=0.2V, the power conversion efficiency PCE>50%.

In FIGS. 18e and 18f, the SBD ladder circuit works with both phase AC signal generators, which are 180° apart. The body resistor can be as low as 10 s ohms, the C of the charge pump can be 2 pF, the source impedance can be 70 ohm, this makes the time constant of 200 ps. Note that the diodes only see no more than 1 Vp reverse biasing, and the on chip/module charge pump operation can be in the giga-Htz range.

Figure 19A:
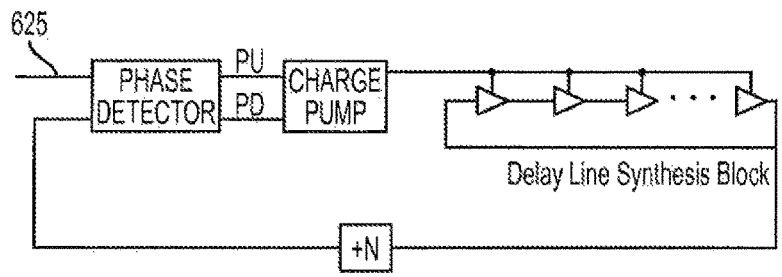
FIG. 19*a*-19*h* shows transistor level designs for the SCL type Hi-Frequency timing blocks, including PLL, delay lines, wave forming cells and multipliers.
Figure 19B:
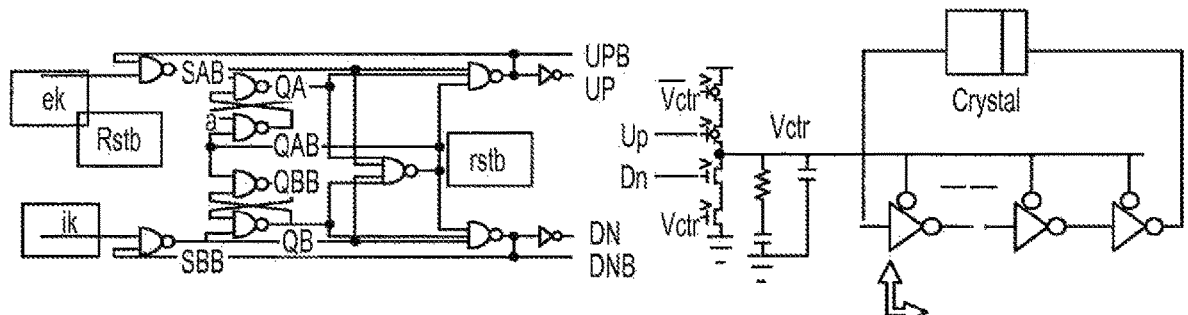
Figure 19C:
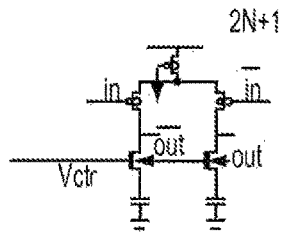
Figure 19D:
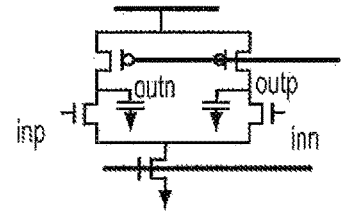
Figure 19E:
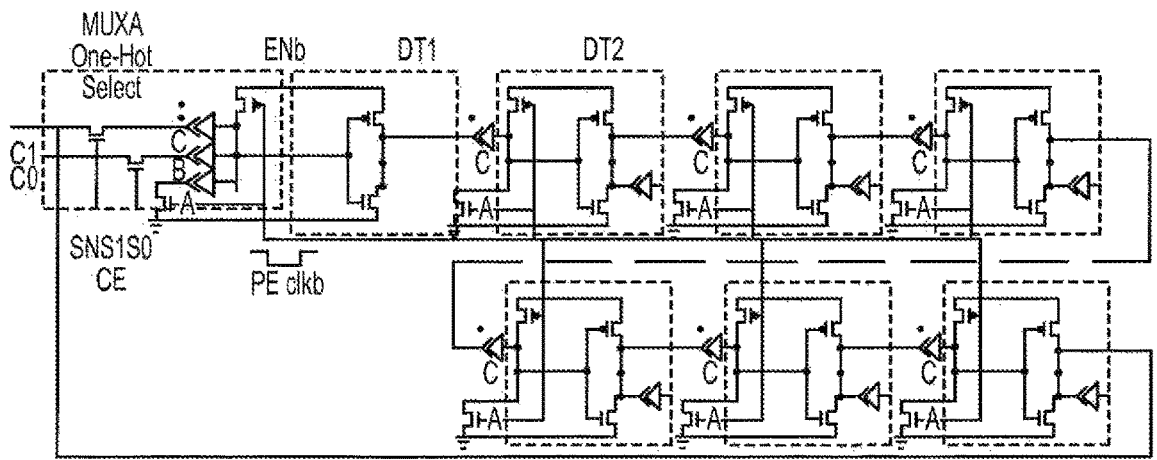
Figure 19F:
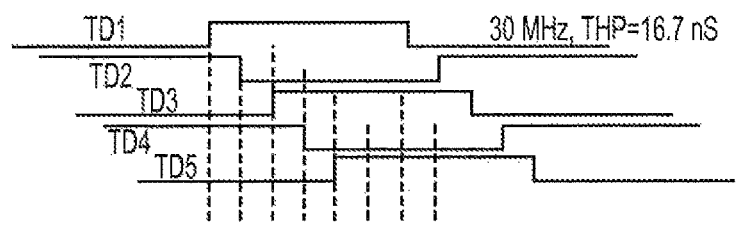
Figure 19G:
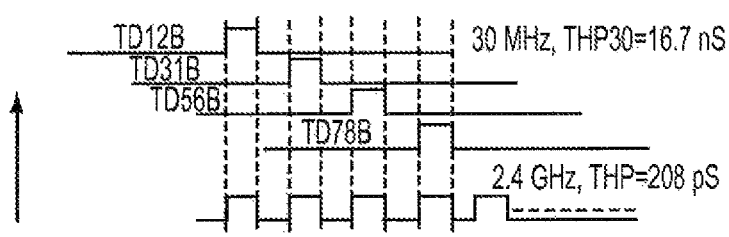
Figure 19H:
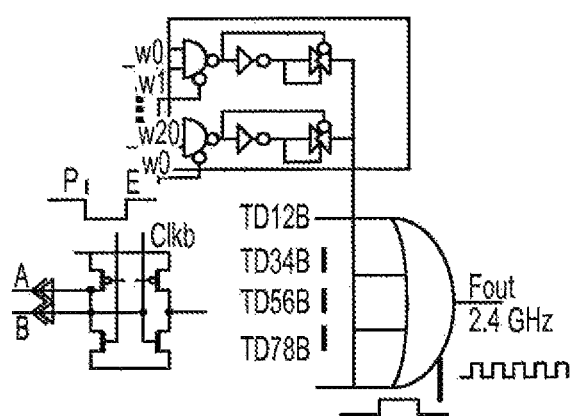

FIG. 19a-19g describes a PLL and frequency multiplier implementation using SCL macros. All the TTL NAND gates are implemented by the SCL gates. The delay line synthesis block, shown in FIGS. 19c and 19d by prior arts, is implemented by the inverter strings with external crystal for stability. This low frequency loop offered 30 MHz oscillators. Other means of generating 30 MHz loops may use the CMOS TTL gates, and/or SCL gates as shown in FIG. 19e, the present invention. Here the feedback delay line leads are muxed by transistor-diode pairs, One Hot Selection (OHS) cell, where only one of the control signals determines the low frequency pulse width.

The 30 MHZ wave form (Pulse width is 16.7 nS) are shifted to form 208 ps pulses by firstly the NA2 gates (FIG. 19F-19G), followed by the NOR tree to generate the 2.4 GHz bit clock at 2.4 GHz.

FIG. 20 showed the Controller for the DRAM SIM modules. By using a SCMOS controller, lower bus signal wires can be designed, lowering it to 1.2V, the DRAM chips are also accept this lowered address and data signals, and there are internal peripheral circuit with SCL interfaces. This new controller and chips will operate at DDR3 and DDR4 speed while burning less power.

The SCMOS device specifications are summarized as follows.

SCMOS Device Specifications
1. Fab. Process/Circuit Elements
   Devices: CMOS extension, Tx. Res. C, +Low Barrier Schottky Diode
   Trench/ROX Isolation
   Planar zed multi-layer metal(1-6)/poly (2)+3D proximity controls
2. Layout Rules/Feature Size
   Horizontal Rule Shrink Strategy: 3 um→1 um>0.25 um>90 nm>22 nm
   Vertical Rule Shrink Box: 200→70 nm
   Insulator: 10 nm
3. Power Supply Scaling
   Chip Supply: 2.5>1.8>1.2>0.9>0.6V
   Internal HV: 20>10>5
   Tx Vt: 1.1>0.9, 0.7, 0.5V
4. Mixed Signal Chip Circuits
   Keep Simple CMOS blocks<2way TTL
   CMOS-TTL>Dynamnic SCL, SPTL, FJ gates/active nodes
   Arrays: MLC SFlash, SBD Mask/ROM/OTP, PSRAM, SRAM, Class D Audio, Video Amp. RF, Multi-Bit ADC/DAC, SFPGA
   Fast wake up, Asyn/Syn clocks, HDHS State machines, FPGA
   SPLL Gbps nets
   Module/PCB nets
   Standalone chips>PC and Bio-Lab programmable Chips, Solar panels, CSP, USB2+interface, moderately high BW (10/100 MHz) wires
   Fully buffered 2-4 level switching nets 0.6-5 V swing Mixed CMOS and SCMOS SOC Embedded ALM Blocks The proposed high frequency generation described above is based on the controllable phase splitting and simple SCL type logic circuit for signal processing. Rather than generating high frequency directly with higher jitter, a secure lower frequency oscillation is controlled, then manipulated with the lower range oscillatory circuit waveforms to composite and synthesize very high frequency signals. The procedures from the above embodiments may be altered to yield equally spaced switching edges with the combination of fine granular segment delays and simple mathematical divisions. Simple D-flip flop stages will yield dual or quad-phase division, the inserted SCL inverters will match and patch any timing gaps with fine granularity under 100 ps.

Still other main benefits of the generic SCL circuits are summarized below.
1. Simple circuit configurations.
2. Space savings.
3. Mixed hard/soft code storage.
4. Mixed RAM, IO, ROM blocks.
5. Easy to control RC time constant of every nets it couples.
6. Build-in power stop and quick wake-up.

These features are important to all high-speed nets especially to PLL/DLL circuitry in mobile computing. Using SCL type logic and PLL can insure fast speed, space saving and power economical.

The Most Important Concepts with the SCMOS IC

The most important concepts with the SCMOS IC lie in several areas.
1. Active switching elements, shifted from transistors to SBDs and integrated transistors, which are extremely high speed in 10 s of GHz.
2. Class D I-V operating points of switching elements are closest to the origin, say at 0.1 V, 1 µA, burning prorated stub-u-watts.
3. Logic operation modes changed from static to static and dynamical.
4. The DTL circuits only uses single internal node, and single power supply and small signal swing, which can be 0.6V. There were no stacking transistors, nor high RC data paths.
5. All ALM blocks can be operated from 5-0.6V, with synchronous and asynchronous duty cycles.

All standard CMOS (TTL) functions are retained. Use of the SCMOS super macros is at user's options and discretions. The guidelines are any complex gates having more than 2-way TTL implementations are recommended to switch over to DTL counter parts.

Since the SCMOS devices and the diode-transistor components hold superior benefits both as ideal switching elements and ultimate system building blocks, its library shall cover the whole domain of semiconductor microelectronics infrastructures; prior, present, and future applications. The SCMOS devices, which support both the dynamic and static operations with the new super set macros, shall also retain all simple CMOS (TTL) and Flash circuits. It can overhaul all previous art works of BJT and CMOS implementations, and it can be ported to any fabrication lines from 4 IN to 15 IN manufacturing facilities.

This super set solution is called the SCMOS technology. Basically, it is compatible with the processes of CMOS and Flash transistors, with the exception of thermal and electrochemical treatments related to the SBD barrier metals. SCMOS devices may extend its applications beyond all ALM fields to IT, computer and communication chip sets. With embedded, multi-cores (i.e., RAM, ROM, Flash, DSP blocks), the chips have powerful speed, multimedia functionality, and capacity. Each of the SoC chips can deliver full audio, video, and data processing and storage services as a subsystem component, and the PCB and module units may support more aggressive server functions.

A-Si Thin Film and Photon-Voltaic Electricity Generation and Solar Engines

Since the advanced IC have significant thin film infrastructures post contact metal, it is further proposed that SBD can be made with metallic and A-Si compound in the thin film regions, and SCMOS devices may extend to support:
1. Photon-Voltaic (PV) cells, solar engines.
2. Bio-chip and life science experiments, DNA and cancer researches.

Traditionally, there were PV cell constructs based on Si/SiGe PN junction and GaAs materials. The best solar power conversion efficiency in the state of the arts ranged from 6-30% for low cost and hi-grade PV generation schemes. The PV process activates at Eg=1.1 eV, A-Si at 1.4 eV, and GaAs at 1.8 eV. The main problem was that the conversion spectrum missed a main component of the infrared, which represents 49% of the solar energy.

It was discovered that the Co/Ti, Si P—, and Si N-bed offered ideal 3-band subsystem. The Si valence band, and electron band are 1.1 eV apart, the metal work function sits in between at 0.52 eV. Both P-type and N-type SBD device I-V characteristics in the TSMC labs were observed (FIG. 4). Complementarily PV actions can be found in the A-Si and metal thin film layers, and the band gap should be near 0.7+−0.2 eV. This could fulfill a designer's dream if the PV apparatus can be developed so that the solar power generation system efficiency may be upgraded to 20~50% or greater. Not only can small chips can be self energized by lights and optical means, but large power grid facilities can be assembled for home, commerce, and industrial use.

The Hybrid IC/Bio-Lab System

Small signal swing and low radiation are important attributes for medical and health considerations in human device interfaces. In 2005, Harvard scientists reported a hybrid system of the IC chips and bio-lab experimental assembly (FIG. 8). The base assembly uses a low power Si chip. In the thin film areas above the Si chips, it drives, an array of um spaced metal coils which control the magnetic field patterns that manipulates the motions of the bio-cell molecules, which are spherically shaped and coated by magnetic sensitive beads and were floating in the bio-fluid solution in the upper duct controlled by valves. This device is used to conduct life science cell research, bio-medical experiments, DNA analysis, and cancer studies. It is vital that the chips in operation are of extremely low power, so the heat generated in the assembly is small, and the temperature of the bio-lab environment are maintained at body temperatures.

The Lowest Cost and Fastest Mask Programmed ROM

The electrical erasable and programmable EEPROM memory has received wide attention in the last decade. A Flash memory cell, with its multiple bit (2/4) storage capability in one physical cell layout, is a better choice to implement information storage devices. However, it has two drawbacks hindering its applications.

1) It requires several masks and wafer process steps, plus the device operations are somewhat destructive and it has endurance problems.

2) The circuit operations are the most complicated and slow. The reading of the first byte is in u-seconds, and the writing of the arrays is even slower. The large performance gap of the EEPROM blocks kept it distant from integration with the high speed processor blocks in the same chip, so EEPROM can only serve as a storage device to compete against the rotating disks. Accordingly, what is needed is a system and method for providing a field programmable gate arrays (FPGA) with the SCL means, which overcomes the above-identified problems. The present invention addressed by such a need.

The Densest and Fastest NV Memory Unit is Missing

The density, power, and speed capability of Flash arrays exceed that of rotating disks, so the semiconductor EEPROM is replacing the mechanical disk medium in many applications. However, the Flash memory cell should have replaced DRAM/SRAM if the speed performance was improved, besides its superior property of being nonvolatile and having a density of multi-level per cell for information storage. However, little work was developed to employ the FLASH technology to work with high speed logic processing applications. The author (FIG. 10) reports using the EEPROM as switches to wire or reconfigure circuits in a FPGA design methodology. Altera and Xilinx offer field programmable chips to interconnect various CMOS hardware constructs to form complex circuit functions. The standalone FPGA devices support re-configurable control functions that are easy to change with instant deliverable parts. Nevertheless, their speed grades are unmatched to RAM and logic circuits.

By implementing an ideal high speed and high capacity ROM with the SBD arrays as outlined in FIG. 11, the gaps can be closed between logic units and its slower other system units (Analog, Memory, and Storage codes blocks) on a chip. A 64 MB mask programmed SBD array core in chip with 2 layers of metals can be built, and it reads instruction codes in giga-Htz performance. This NV block, standard logic gates, and small RAM core shall be adequate to support most of the multi-media controller functions. Therefore the various system units can work together smoothly at least in the mobile small systems. The chips can be made by a low cost logic product line starts at 0.25 um.

Benefits of SCMOS IC Expand to PVG, Bio-Lab Chips

1. Combined SCL, SPTL and augmented SCMOS process, device, and circuit means for computer macros, solar cells and energy management, life science, bio-lab experiment, and medical research applications.

2. The SCMOS process and device means are basically compatible to the Bipolar, CMOS, GaAs, SiGe single crystal and amorphous poly Si crystal semiconductor state of the arts, but can be simplified subject to specific commercial applications It uses special metals such as Ti/Co for nich I-V characteristics, added new modes of spectrum photo-voltaic responses.

3. The SCMOS circuit means covers all CMOS macros, but retains all the simple gates. SCMOS build up its own super set macros with unique circuit topology, much more compact layouts, higher speed, lower power consumption, and flexibility.

4. The SCMOS process and device means further include A-Si, and GaAs, SiGe, and thin film processes for various applications in computers and microelectronics, opto-electrical and electro-mechanical machines, solar or other energy conversion and management, and bio-lab and human/animal organ/tissue/cell studies.

5. Combined SCMOS DTL and CMOS TTL standard cell simple gate macros, +SFLash+SFPGA+Shottky SRAM+ Shottky DRAM process, device, and circuit techniques.

SCMOS chips, due to its highest efficiency, may be employed to manipulate energy conversion tasks.

6. There are new modes of energy conversion band gaps other than the PN junction band (1.25-0 eV), such as 0.52-0 eV, and 1.0-0.52 eV; wherein the new apparatus shall upgrade solar PV generation in all cases of commercial systems by converting the infra red rays. The overall system PV conversion efficiency may be significantly improved from present 11-30% range to 15-50% or better.

The SCMOS microelectronics chips may be employed in the Bio-lab-chip assemblies with bio-fluid control apparatus. Its low cost and low power nature and 3D cell motion manipulations by electro-mechanical controls provide ideal medical lab environments for bio-cell characterizations, and life science experiments.

a. Diode replaces transistor functions—for all analog, logic, and memory fields.

b. Circuit benefits:
      i. Integration schemes to reduce total layout areas of transistors, net, and gate counts, and wiring distances, stray capacitances;
      ii. Access speed gains;
      iii. Power savings; and
      iv. Yield enhancements due to area reduction and lower current and voltage stressing. Have less stressed components.
      v. Integrated flexibility-instantaneous re-configurable hw/sw resources.

6. Under SCMOS circuit means, the SCL library contains SCL, SPTL type embodiments of:

1. Phase Detector for frequency and phase comparison.
2. Time delay element, and delay chains.
3. Nature on-chip ring oscillator, most efficient chargers for the GHz switching power supplies.
4. Feedback crystal oscillator for low and moderate clocks.
5. Waveform combiner 1 with pass transistor logic and Schmitt trigger means to multiply frequency for GHz clocks.

6. Waveform combiner 2 with inverter-chain and delay selector means to multiply frequency for GHz clocks.
7. D-register for frequency divider.
8. Frequency multiplier scheme.
9. Two phase non-overlap Clock generator and driver scheme.
10. Integration means for SCL, RAM (SRAM, DRAM, SDRAM, DDR3 DRAM, ROM, and FPGA technology.
11. Integration means for data storage, processing, transfer and boot codes.

Advantages

1. Integration means for digital and analog data acquisition and conversions including ATD/DTA converters. Under SCMOS circuit means, the Photo Voltaic cells may contain both Si single crystal and A-Si special metal Si compounds layers, in chips and other thin film structures, and
   a. including GaAs and Si Ge materials and panels for the solar electricity generation apparatus. Aimed to include more activation modes of energy absorption and conversions from the well known prior arts of Eg equal to 1.8, 1.4 and 1.1 eV.
   b. Collectively increases conversions of in far red region, of lights with Eg from 0.52, 0.7, and 0.9 eV, hence the overall system efficiency from 6-30% to 10-50% or better.
2. Under SCMOS circuit means, construct devices to conduct bio-lab experiments for life science and medical equipments that characterize biological cell activities, tissue and organ structures, disease controls, monitoring and cure methods.
3. Under SCMOS device and circuit means, construct various memory cores for SOC level subsystems in chips, module and PC forms of device assemblies.
   a. low cost Mask programmed ROM
   b. Static and dynamic RAM
   c. Flash array
   d. Static and dynamic logic cells, shift registers, latches
   e. Pass transistor logic cells
4. The mixed application of the above SCMOS design platform shall benefit the performance and cost factors of all categories and grades of the microelectronics product, past, current, and future generations, specifically including but not limited to hardware and software means for:
   a. Handheld small systems for computers and communication devices.
   b. Solar electricity generation, and solar engines for motions, heating, and sensors, switching power supply units.
   c. Medical and life science equipments.

The complementary low threshold Schottky barrier diodes (SBD) and transistors (BJT, CMOST, and FlashT of Si, GaAs, or SiGe) are device component pairs for integrated circuits (IC). They offer advantages as generic elements in forming macro functions with superb performance and elegant compactness. Using IC process compatible means, and a special DTL like circuit topology, we can build Analog, Logic and Memory (ALM) functional blocks, and then reuse them collectively for simple and advanced IC chips, modules, and PCB assembled subsystems. Prior art in IC were from the Bipolar and CMOS devices; the new types of IC devices, the family of Schottky CMOS or Super CMOS (SCMOS) devices.

SCMOS device contains all simple gates of CMOS macros. However, all complicated macros with more than 2 way inputs are reconfigured by DTL implementations, and may operated statically and/or dynamically with VCC to 1.2V or lower. The SCMOS super set ALM macros show orders of magnitude better in performance and low cost figures than the standard CMOS circuits. They achieve area compactness and high speed gain ratios (2:1), high capacity in RAM and NV mask ROM, Flash programmable memory storage (4 $F^2$/bit) in Giga Hz and Mega Bytes, and extremely low power dissipation (4:1). Full benefits are for PC and handheld devices in mobile systems. Where mixed low signal swing chip nets deliver energy efficient data transactions and controls with high speed and high capacity memories, low power, and low cost SoC cores. Open ended emerging applications involving, metal suicide compounds with amorphous Si (A-Si) thin films penetrating into photon voltaic field of solar cell and engines, life science field of bio-lab experiment, and medical researches for human organ, tissue and cells.

The SCMOS microelectronics chips may be employed in the Bio-lab-chip assemblies with bio fluid control apparatus. Its low cost, low power nature and 3D cell motion manipulations by electro-mechanical controls provide ideal medical lab environments for bio-cell characterizations, and life science experiments.

A means and control schemes are disclosed to field program basic circuit element or any critical nets, and to alter the functionality of certain predetermined circuit units, and update array Interconnections, accessing stored protocols, algorithms in ail chips in the embodiment subsystem of a SFPGA chip sets.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A memory device, comprising:
   an array of memory cells having a first number of rows and a second number of columns, each memory cell being formed at a cross section of one of the first number of rows and one of the second number of columns;
   a plurality of word interconnects and a plurality of bit interconnects, each bit interconnect electrically coupled to a respective column of memory cells, each word interconnect electrically coupled to a respective row of memory cells, wherein each memory cell includes a respective Schottky barrier diode (SBD) electrically coupled to and configured to be driven by a respective one of the plurality of word interconnects and a respective one of the plurality of bit interconnects;
   a peripheral interface circuit including a plurality of address buffers, the peripheral interface circuit configured to address the memory cells in the array via the plurality of word interconnects and the plurality of bit interconnects; and
   a sense amplifier coupled to one or more of the plurality of bit interconnects, the sense amplifier configured to read data stored in the array of memory cells;
   wherein each of the plurality of bit interconnects is electrically coupled to the sense amplifier via a sense SBD having a cathode and an anode that are coupled to the respective bit interconnect and the sense amplifier, respectively.

2. The memory device of claim 1, further comprising:
a latch coupled to the sense amplifier, the latch being configured to hold the data read by the sense amplifier from the array of memory cells.

3. The memory device of claim 1, wherein for each memory cell, the respective SBD is attached to a diffusion bed of a first transistor device and includes a metal barrier contact to the diffusion bed of the first transistor device, wherein the respective SBD and the first transistor device are isolated from one or more alternative semiconductor devices on the memory device via an isolation trench.

4. The memory device of claim 1, wherein for each memory cell, the respective SBD is attached to a diffusion bed of a first transistor device and includes a metal barrier contact to the diffusion bed of the first transistor device, wherein the memory device includes a sub-implant layer that is buried underneath the respective SBD, and the first transistor device does not lie on top of the sub-implant layer.

5. The memory device of claim 1, wherein the memory device has a quiescent state in which both the plurality of word interconnects and the plurality of bit interconnects are electrically coupled to ground, and the SBD of each memory cell is not electrically stressed.

6. The memory device of claim 1, wherein a first memory cell is coupled to a first word interconnect and a first bit interconnect, and the memory device has an active mode in which the first memory cell is selected for a memory read operation when the first word interconnect is biased at a first supply voltage that is higher than ground and the first bit interconnect is biased at a second supply voltage that is a diode voltage less than the first supply voltage.

7. The memory device of claim 1, wherein the respective SBD of each memory cell includes an n-type SBD.

8. The memory device of claim 1, further comprises:
at least one transistor device selected from a group consisting of a metal oxide field effect transistor device (MOSFET), a bipolar junction transistor device (BJT) and a multi-level cell FLASH transistor.

9. The memory device of claim 8, wherein the at least one transistor device is based on at least one of Silicon (Si), Silicon-Germanium (SiGe), Gallium Arsenide (GaAs), Gallium Nitride (GaN), Indium Phosphide (InP), and other III-V Compound Semiconductor materials and combination thereof.

10. The memory device of claim 8, wherein the at least one transistor device includes a gate surrounded by a layer of tunnel oxide having an oxide thickness that is substantially equal to or less than 10 nm.

11. The memory device of claim 8, wherein a respective SBD of a first memory cell and the at least one transistor device are disposed in a semiconductor well on a substrate of the memory device.

12. The memory device of claim 1, wherein the respective SBD of each memory cell includes a metal barrier contact.

13. A memory device, comprising:
an array of memory cells having a first number of rows and a second number of columns, each memory cell being formed at a cross section of one of the first number of rows and one of the second number of columns;
a plurality of word interconnects and a plurality of bit interconnects, each bit interconnect electrically coupled to a respective column of memory cells, each word interconnect electrically coupled to a respective row of memory cells, wherein each memory cell includes a respective Schottky barrier diode (SBD) electrically coupled to and configured to be driven by a respective one of the plurality of word interconnects and a respective one of the plurality of bit interconnects;
a peripheral interface circuit including a plurality of address buffers, the peripheral interface circuit configured to address the memory cells in the array via the plurality of word interconnects and the plurality of bit interconnects; and
a sense amplifier coupled to one or more of the plurality of bit interconnects, the sense amplifier configured to read data stored in the array of memory cells;
wherein at least one of the plurality of address buffers includes two complementary SBDs and two complementary transistors.

14. The memory device of claim 13, wherein the two complementary SBDs are formed within the two complementary transistors.

15. The memory device of claim 13, wherein each of the plurality of bit interconnects is electrically coupled to the sense amplifier via a sense SBD having a cathode and an anode that are coupled to the respective bit interconnect and the sense amplifier, respectively.

16. The memory device of claim 13, wherein the respective SBD of each memory cell includes a p-type SBD.

17. A memory device, comprising:
an array of memory cells having a first number of rows and a second number of columns, each memory cell being formed at a cross section of one of the first number of rows and one of the second number of columns;
a plurality of word interconnects and a plurality of bit interconnects, each bit interconnect electrically coupled to a respective column of memory cells, each word interconnect electrically coupled to a respective row of memory cells, wherein each memory cell includes a respective Schottky barrier diode (SBD) electrically coupled to and configured to be driven by a respective one of the plurality of word interconnects and a respective one of the plurality of bit interconnects;
a peripheral interface circuit including a plurality of address buffers, the peripheral interface circuit configured to address the memory cells in the array via the plurality of word interconnects and the plurality of bit interconnects;
a sense amplifier coupled to one or more of the plurality of bit interconnects, the sense amplifier configured to read data stored in the array of memory cells;
a plurality of word decoders coupled to the plurality of word interconnects, each decoder including at least a NOR logic gate; and
a plurality of bit decodes coupled to the plurality of bit interconnects, each bit decoder including at least a NAND logic gate.

18. The memory device of claim 17, wherein the respective SBD of each memory cell has a substantially low threshold voltage that is no greater than 0.5V.

19. The memory device of claim 17, wherein the respective SBD of each memory cell includes a low barrier SBD.

20. The memory device of claim 17, wherein the respective SBD of each memory cell includes a cathode, an anode, and a blockout region disposed on top of one of the cathode and the anode.

* * * * *